(12) United States Patent
Iwata

(10) Patent No.: US 10,971,644 B2
(45) Date of Patent: Apr. 6, 2021

(54) PHOTODETECTION DEVICE, PHOTODETECTION SYSTEM, AND MOVING BODY

(71) Applicant: CANON KABUSHIKI KAISHA, Tokyo (JP)

(72) Inventor: Junji Iwata, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/203,251

(22) Filed: Nov. 28, 2018

(65) Prior Publication Data

US 2020/0028018 A1   Jan. 23, 2020

(30) Foreign Application Priority Data

Nov. 30, 2017  (JP) .............................. JP2017-230987

(51) Int. Cl.
| | |
|---|---|
| *H01L 31/107* | (2006.01) |
| *H01L 31/02* | (2006.01) |
| *G01S 17/08* | (2006.01) |
| *G01S 7/4861* | (2020.01) |

(52) U.S. Cl.
CPC .......... *H01L 31/107* (2013.01); *G01S 7/4861* (2013.01); *G01S 17/08* (2013.01); *H01L 31/02027* (2013.01); *B60W 2420/403* (2013.01)

(58) Field of Classification Search
CPC ............. H01L 31/107; H01L 31/02027; G01S 7/4861; G01S 17/08; G01S 7/4816; G01S 17/48; G01S 17/89; G01S 17/931; G01S 7/4866; B60W 2420/403
See application file for complete search history.

(56) References Cited

U.S. PATENT DOCUMENTS

| | | | |
|---|---|---|---|
| 9,209,336 B2 | 12/2015 | Sanfilippo | |
| 2010/0271108 A1* | 10/2010 | Sanfilippo | ............. H01L 31/107 327/502 |
| 2018/0108800 A1 | 4/2018 | Morimoto | |
| 2018/0113200 A1* | 4/2018 | Steinberg | ................. G08G 1/04 |
| 2018/0308881 A1* | 10/2018 | Hynecek | ............... H01L 31/107 |

* cited by examiner

*Primary Examiner* — Steven H Loke
*Assistant Examiner* — Juanita B Rhodes
(74) *Attorney, Agent, or Firm* — Canon U.S.A., Inc. IP Division

(57) ABSTRACT

An avalanche diode is provided and includes a first semiconductor region and a second semiconductor region. At a deeper position, the avalanche diode includes a third semiconductor region having an impurity concentration lower than that of the first semiconductor region, and a fourth semiconductor region having an impurity concentration lower than that of the second semiconductor region. At a further deeper position, the avalanche diode includes a fifth semiconductor region having an impurity concentration lower than that of the third semiconductor region. In a plan view, the first semiconductor region overlaps at least a part of the third semiconductor region, the second semiconductor region overlaps at least a part of the fourth semiconductor region, and the third and fourth semiconductor regions overlap the fifth semiconductor region.

21 Claims, 16 Drawing Sheets

FIG. 10

PHOTODETECTION DEVICE, PHOTODETECTION SYSTEM, AND MOVING BODY

BACKGROUND

Field

The present disclosure relates to at least one of a photodetection device, a photodetection system, and a moving body.

Description of the Related Art

Photodetection devices that are capable of detecting weak single-photon-level light using avalanche (electron avalanche) amplification have been known.

U.S. Pat. No. 9,209,336 discusses a Single Photon Avalanche Diode (SPAD) in which avalanche amplification is caused by photoelectric charge due to a single photon in a PN-junction region of a semiconductor region constituting a photoelectric conversion unit.

In addition, in the SPAD of U.S. Pat. No. 9,209,336, a P-type semiconductor region having a high impurity concentration is disposed on a front surface of a semiconductor substrate and an N-type semiconductor region is disposed below the P-type semiconductor region. The N-type semiconductor region is disposed so as to be included in an N-type epitaxial layer. The P-type semiconductor region and the N-type semiconductor region form a PN junction, and a high reverse bias voltage is applied to the PN junction.

In the SPAD discussed in U.S. Pat. No. 9,209,336, a charge detection region corresponds to a PN junction region. Since a strong electric field is generated in the electric charge detection region, a tunneling effect may occur between PN junctions due to the strong electric field. The electric charge generated by the tunneling effect is detected as a false signal in the electric charge detection region, which may cause noise. The electric charge generated by this tunneling effect increases in proportion to the area of the electric charge detection region.

On the other hand, when the area of the electric charge detection region is made small, it is possible to suppress the electric charge generated by the tunneling effect. However, when the area of the electric charge detection region is made small, the light detection efficiency may be lowered.

SUMMARY

The present disclosure describes a photodetection device capable of suppressing a reduction in light detection efficiency while suppressing noise.

According to an aspect of the present disclosure, a photodetection device includes a semiconductor substrate including a first surface and a second surface opposed to the first surface and a pixel disposed on the semiconductor substrate, the pixel including an avalanche diode that includes. The avalanche diode includes, at a first depth of the semiconductor substrate, a first semiconductor region of a first conductivity type and a second semiconductor region of a second conductivity type, the second semiconductor region being in contact with the first semiconductor region and having a polarity different from the polarity of the first conductivity type. The avalanche diode includes, at a second depth deeper than the first depth from the first surface of the semiconductor substrate, a third semiconductor region having a concentration of an impurity of the first conductivity type lower than the first semiconductor region, and a fourth semiconductor region of the second conductivity type being in contact with the third semiconductor region and having a concentration of an impurity of the second conductivity type lower than the second semiconductor region. The avalanche diode includes, at a third depth deeper than the second depth from the first surface of the semiconductor substrate, a fifth semiconductor region having the concentration of the impurity of the first conductivity type lower than the third semiconductor region. In a plan view, the avalanche diode is arranged such that, the first semiconductor region overlaps at least a part of the third semiconductor region, the second semiconductor region overlaps at least a part of the fourth semiconductor region, and the third semiconductor region and the fourth semiconductor region overlap the fifth semiconductor region.

According to another aspect of the present disclosure, a photodetection device includes a semiconductor substrate including a first surface and a second surface opposed to the first surface and a pixel disposed on the semiconductor substrate, the pixel including an avalanche diode. The avalanche diode includes, at a first depth of the semiconductor substrate, a first semiconductor region having a first conductivity type same as a signal electric charge, and a second semiconductor region of a second conductivity type being in contact with the first semiconductor region and having a polarity different from the first conductivity type. The avalanche diode includes, at a second depth deeper than the first depth from the first surface of the semiconductor substrate, a third semiconductor region and a fourth semiconductor region being in contact with the third semiconductor region and having a concentration of an impurity of the second conductivity type lower than the second semiconductor region. The avalanche diode includes a fifth semiconductor region disposed at a third depth deeper than the second depth from the first surface of the semiconductor substrate. A sixth semiconductor region is provided between the first semiconductor region and the second semiconductor region. In a plan view, the avalanche diode is arranged such that, the first semiconductor region overlaps at least a part of the third semiconductor region, the second semiconductor region overlaps at least a part of the fourth semiconductor region, and the third semiconductor region and the fourth semiconductor region overlap the fifth semiconductor region. A height of a potential with respect to a signal electric charge in the third semiconductor region is lower than a height of a potential with respect to the signal electric charge in the fourth semiconductor region. A height of a potential with respect to the signal electric charge in the fourth semiconductor region is higher than a height of a potential with respect to the signal electric charge in the fifth semiconductor region.

BRIEF DESCRIPTION OF THE DRAWINGS

FIG. 10 is a schematic sectional view according to a second exemplary embodiment.

DESCRIPTION OF THE EMBODIMENTS

A photodetection device according to an exemplary embodiment of the present disclosure will be described with reference to FIGS. 1 to 3. The photodetection device according to the present exemplary embodiment includes a pixel including an avalanche diode. A conductivity type of electric charge used as signal electric charge in an electric charge pair generated in the avalanche diode is referred to as a first conductivity type. The conductivity type opposed to the first conductivity type is referred to as a second conductivity type.

Figure 1:
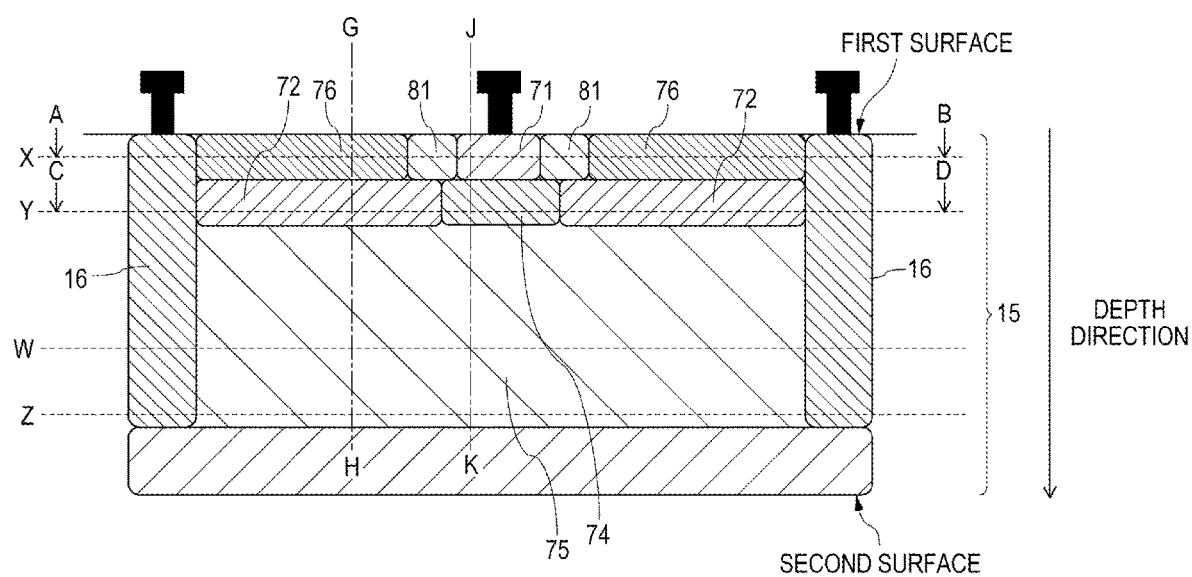
FIG. 1 is a schematic sectional view illustrating an avalanche diode.

FIG. 1 is a schematic sectional view illustrating the avalanche diode according to the present exemplary embodiment. The avalanche diode of the present exemplary embodiment is disposed on a semiconductor substrate 15. The semiconductor substrate 15 includes a first surface and a second surface opposed to the first surface. For example, the first surface is a front surface of the semiconductor substrate 15, and the second surface is a back surface of the semiconductor substrate 15. In the present exemplary embodiment, a depth direction is from the first surface toward the second surface. On the first surface side (front surface side) of the semiconductor substrate 15, a gate electrode of a transistor and a multilayer wiring structure are arranged (not shown in FIG. 1).

Referring to FIG. 1, a first semiconductor region 71, a third semiconductor region 74, a fifth semiconductor region 75, and a sixth semiconductor region 81 of the first conductivity type are disposed in a region sandwiched by separation portions 16. In addition, a second semiconductor region 76 and a fourth semiconductor region 72 of the second conductivity type are disposed in the region sandwiched between the separation portions 16.

In the semiconductor substrate 15, the first semiconductor region 71, the second semiconductor region 76, and the sixth semiconductor region 81 are disposed at a first depth X. The first semiconductor region 71 and the sixth semiconductor region 81, and the sixth semiconductor region 81 and the second semiconductor region 76 are in contact with each other in a plan view. In this case, the fact that the first semiconductor region 71 and the second semiconductor region 76 are disposed at the first depth X indicates that the first semiconductor region 71 and the second semiconductor region 76 are present in the cross-section at the depth X. The plan view is a plan view with respect to the first surface. Further, the impurity concentration of a predetermined impurity in a predetermined region is the net impurity concentration of the predetermined impurity, which indicates the so-called net impurity concentration.

In the semiconductor substrate 15, the third semiconductor region 74 and the fourth semiconductor region 72 are disposed at a second depth Y which is deeper than the first depth X with respect to the first surface. The third semiconductor region 74 and the fourth semiconductor region 72 are in contact with each other in a plan view. The fourth semiconductor region 72 is disposed between the third semiconductor region 74 and the separation portion 16.

In the semiconductor substrate 15, the fifth semiconductor region 75 is disposed at a third depth Z which is deeper than the second depth Y with respect to the first surface.

Figure 2A:
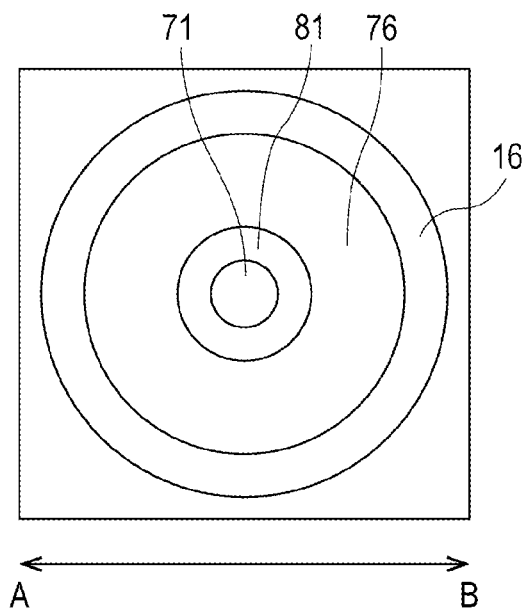
FIGS. 2A and 2B are schematic plan views each illustrating an avalanche diode.
Figure 2B:
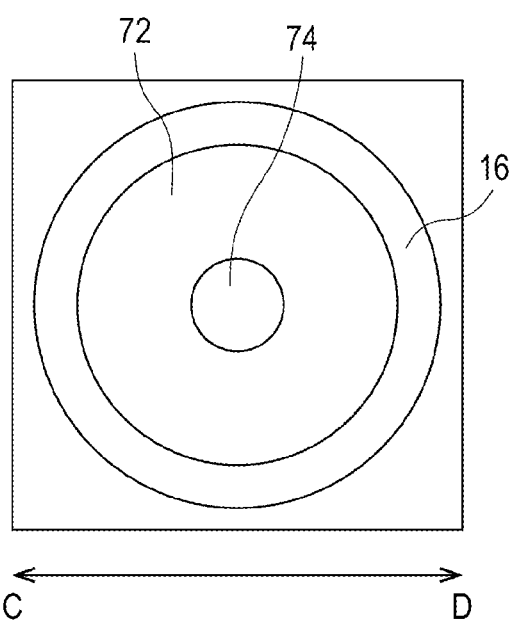

FIGS. 2A and 2B are schematic plan views. FIG. 2A is a schematic plan view taken along a dotted line A-B at the first depth X. FIG. 2B is a schematic plan view taken along a dotted line C-D at the second depth Y.

As illustrated in FIG. 2A, at the first depth X, the first semiconductor region 71 is included in the sixth semiconductor region 81, and the sixth semiconductor region 81 is included in the second semiconductor region 76. That is, the first semiconductor region 71 is included in the second semiconductor region 76. In addition, the second semiconductor region 76 is included in the separation portions 16.

As illustrated in FIG. 2B, at the second depth Y, the third semiconductor region 74 is included in the fourth semiconductor region 72. The fourth semiconductor region 72 is included in the separation portions 16. As illustrated in FIGS. 1 and 2A and 2B, in a plan view, the first semiconductor region 71 overlaps at least a part of the third semiconductor region 74, and the third semiconductor region 74 and the fourth semiconductor region 72 overlap the fifth semiconductor region 75. Further, the second semiconductor region 76 overlaps at least a part of the fourth semiconductor region 72.

Figure 3:
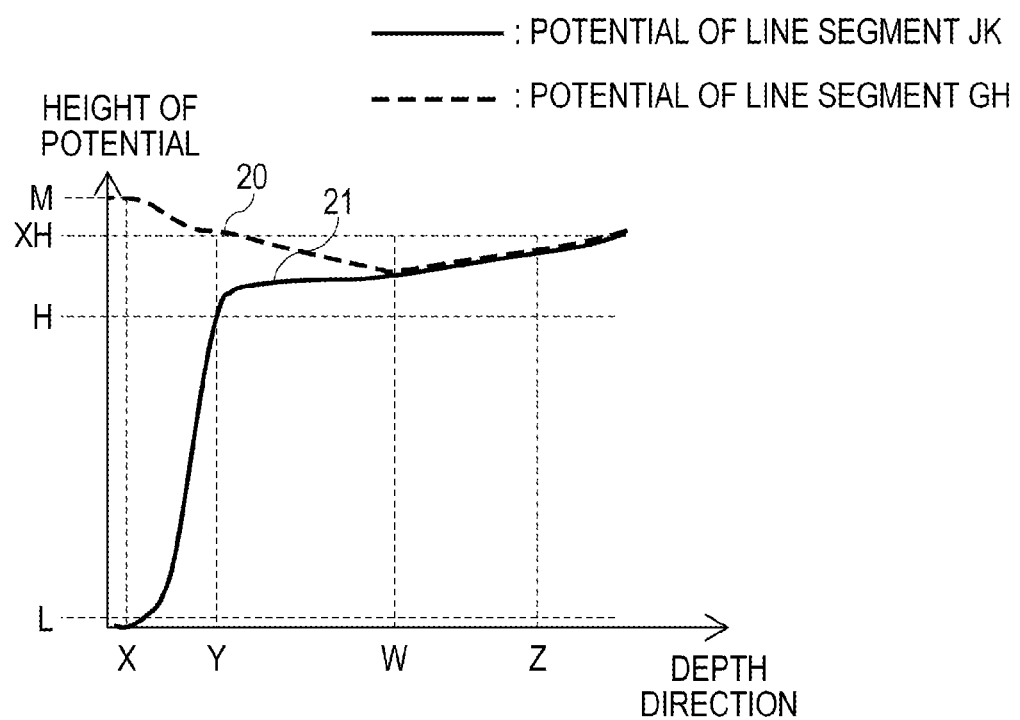
FIG. 3 is a graph illustrating a potential of the avalanche diode.

FIG. 3 is a graph illustrating a potential of the avalanche diode. FIG. 3 illustrates an example of a potential distribution of a line segment GH and a line segment JK in the sectional view illustrated in FIG. 1. A dotted line 20 represents the potential distribution of the line segment GH, and a solid line 21 represents the potential distribution of the line segment JK. In this case, the potential seen from an electron which is signal electric charge is illustrated. When the signal electric charge is a hole, the relationship of the potential level is reversed.

In FIG. 3, depths X, Y, W, and Z correspond to the respective depths illustrated in FIG. 1, and the depth W is an arbitrary depth between the depth Y and the depth Z.

A height XH of the potential indicates the height of the potential of the fourth semiconductor region 72. A height H of the potential indicates the height of the potential of the third semiconductor region 74. A height M of the potential indicates the height of the potential of the second semiconductor region 76. A height L of the potential indicates the height of the potential of the first semiconductor region 71.

From the dotted line 20 in FIG. 3, the height of the potential of the line segment GH at the depth Z is the height of the potential between the XH level and the H level. The potential gradually decreases toward the depth W from the depth Z. The potential gradually increases from the depth W toward the depth Y, and reaches the XH level at the depth Y. The potential gradually increases toward the depth X from the depth Y. At the depth X, the potential at the M level is obtained.

From the solid line 21 in FIG. 3, the height of the potential of the line segment JK at the depth Z is the height of the potential between the XH level and the H level. The potential gradually decreases from the depth Z until it approaches the depth Y. The height of the potential begins to drop sharply when approaching the depth Y, and at the depth Y, the height of the potential at the H level is obtained. The height of the potential drops sharply until the potential approaches the depth X from the depth Y. Then, the height of the potential at the L level is obtained at the depth X.

At the depth Z, the potentials represented by the dotted line 20 and the solid line 21, respectively, are substantially at the same height. In FIG. 3, at a depth closer to the depth Z than the depth Y, the potential gradient gradually decreases toward the first surface of the semiconductor substrate 15 in the region indicated by the line segment GH and the line segment JK. Therefore, electric charge generated in the photodetection device moves from the second surface side to the first surface side with a gentle potential gradient.

In FIG. 3, as the depth W approaches the depth Y, the solid line 21 has a potential gradient that gradually decreases, and the electric charge moves toward the first surface. On the other hand, the dotted line 20 has a potential gradient that becomes a potential barrier with respect to the electric charge toward the first surface. This potential barrier suppresses the transfer of the electric charge from the fifth semiconductor region 75 to the second semiconductor region 76. With respect to this potential barrier, the potential in the direction from the region of the line segment GH to the region of the line segment JK is low. Accordingly, the electric charge existing in the region of the line segment GH from the depth W to the depth Y can easily move to the vicinity of the region of the line segment JK in the process of moving to the first surface.

The electric charge which has moved to the vicinity of the region of the line segment JK is accelerated by the steep potential gradient, that is, the strong electric field from the depth Y to the depth X, and the accelerated electric charge reaches the first semiconductor region 71. Avalanche amplification occurs in the region from the depth Y to the depth X. On the other hand, in the region indicated by the line segment GH, the avalanche breakdown does not occur, or the potential distribution in which the avalanche breakdown is less likely to occur than in the region indicated by the line segment JK, particularly, in the region from the depth Y to the depth X of the line segment JK is obtained.

By adopting such a potential structure, it is possible to reduce the noise charge caused by the above-described tunneling effect, as compared with a configuration in which avalanche breakdown occurs in the entire photodiode as discussed in U.S. Pat. No. 9,209,336. In addition, according to the avalanche diode of the present exemplary embodiment, a deterioration in the sensitivity of light having a long wavelength is prevented. This is because the signal electric charge existing in the region overlapping with the fourth semiconductor region 72 in the fifth semiconductor region 75 has a potential structure that easily moves to the first semiconductor region via the third semiconductor region 74.

Specifically, the height of the potential of the third semiconductor region 74 is lower than the height of the potential of the fourth semiconductor region 72. In other words, the fourth semiconductor region 72 functions as a potential barrier against signal electric charge existing in the fifth semiconductor region 75, with the result that the electric charge easily moves to the first semiconductor region 71 via the third semiconductor region 74.

On the other hand, the electric charge photoelectrically converted in the second semiconductor region 76 and the fourth semiconductor region 72 flows into the fifth semiconductor region 75 due to the potential gradient from the depth X to the depth W of the dotted line 20. The electric charge in the fifth semiconductor region 75 can easily move to the third semiconductor region 74 for the reasons described above. As a result, the electric charge photoelectrically converted in the second semiconductor region 76 and the fourth semiconductor region 72 moves to the first semiconductor region via the third semiconductor region 74, and is then detected as signal electric charge by avalanche amplification. Therefore, it is possible to detect charge photoelectrically converted in the second semiconductor region 76 and the fourth semiconductor region 72 as sensitivity. That is, the sensitivity can also be improved for light having a short wavelength.

The entire first semiconductor region 71 may overlap the third semiconductor region 74 in a plan view. According to this configuration, the PN junction between the first semiconductor region 71 and the fourth semiconductor region 72 is not formed. Therefore, avalanche amplification occurs at the PN junction between the first semiconductor region 71 and the fourth semiconductor region 72, and it is possible to suppress occurrence of noise due to the tunneling effect.

An example of the configuration of the impurity region for realizing the above-described potential relationship will be described with reference to FIG. 1. A case where the signal electric charge is an electron will now be described. When the signal electric charge is a hole, the impurity has an opposite conductivity type.

Referring to FIG. 1, a configuration in which the semiconductor substrate 15 has the first surface and the second surface opposed to the first surface, and signal electric charge is extracted via an electrode connected to the first surface will be described by way of example.

The semiconductor substrate 15 includes, at the depth X from the first surface, the N-type first semiconductor region 71 to which the electrode from which signal electric charge is extracted is connected, and the P-type second semiconductor region 76 having a polarity different from that of the first semiconductor region 71. Further, the semiconductor substrate 15 includes the third semiconductor region 74 and the P-type fourth semiconductor region 72. In the third semiconductor region 74, the concentration of an impurity (N-type impurity) imparting N-type is lower than that of the first semiconductor region 71 at the depth Y from the first surface. The concentration of the impurity of the second conductivity type of the fourth semiconductor region 72 is lower than the concentration of the impurity of the second conductivity type of the second semiconductor region 76. Further, the depth Y from the first surface is deeper than the depth X.

The third semiconductor region may be an N-type semiconductor region or a P-type semiconductor region, as long as the third semiconductor region has an N-type impurity concentration lower than that of the first semiconductor region 71. For example, the third semiconductor region may be an N-type semiconductor region and may be in contact with the fourth semiconductor region 72. Alternatively, the third semiconductor region may be a P-type semiconductor region that is continuous from the fourth semiconductor region due to diffusion of impurities or the like in the fourth semiconductor region 72. In this case, the concentration of the impurity of the second conductivity type of the third semiconductor region is lower than the concentration of the impurity of the second conductivity type of the fourth semiconductor region 72. In either case, the N-type impurity concentration of the third semiconductor region is lower than that of the first semiconductor region. As a result, the potential of the first semiconductor region 71 with respect to electrons is lower than the potential of the third semiconductor region 74 with respect to electrons. Therefore, electrons in the third semiconductor region 74 are easily collected in the first semiconductor region 71.

Furthermore, the semiconductor substrate 15 includes the fifth semiconductor region 75 having an N-type impurity concentration lower than that of the third semiconductor region at the depth W from the first surface. The depth W from the first surface is deeper than the depth Y. As a result, the potential for electrons is lower in the third semiconductor region 74 than in the fifth semiconductor region 75. Therefore, electrons generated in the fifth semiconductor region 75 can easily move to the third semiconductor region 74. The fifth semiconductor region 75 may be an N-type semiconductor region or a P-type semiconductor region, as long as the fifth semiconductor region 75 has an N-type impurity concentration lower than that of the third semiconductor region 74.

The semiconductor substrate 15 also includes the sixth semiconductor region functioning as an electric field relaxation layer between the first semiconductor region 71 and the second semiconductor region 76. The sixth semiconductor region may have a concentration and width which can relax the electric field between the first semiconductor region 71 and the second semiconductor region 76 and can suppress noise such as a dark current generated due to the generation of a PN junction therebetween. As long as this function is satisfied, the sixth semiconductor region may be an N-type semiconductor region or a P-type semiconductor region.

In a plan view with respect to the first surface, the first semiconductor region 71 overlaps at least a part of the third semiconductor region 74, and the second semiconductor region 76 overlaps at least a part of the fourth semiconductor region 72. Further, in the plan view, the third semiconductor region 74 and the fourth semiconductor region 72 overlap the fifth semiconductor region 75.

With this configuration, an avalanche diode having a potential structure as described above can be formed.

Therefore, it is possible to realize a photodetection device in which the area of the electric charge detection region is minimized and the amount of collected electric charge generated by photoelectric conversion of light including light having a short wavelength in the electric charge detection region is increased.

Exemplary embodiments of the present disclosure will be described below with reference to specific examples. Each exemplary embodiment illustrates a configuration in which signal electric charge is an electron. However, the present disclosure is also applicable to a case where the signal electric charge is a hole. In that case, the relationship between each semiconductor region and a potential is reversed.

First Exemplary Embodiment

An exemplary embodiment of a photodetection device applicable to the present disclosure will be described with reference to FIGS. 4 to 9B. Portions having functions similar to those illustrated in FIGS. 1 to 3 are denoted by the same reference numerals, and detailed descriptions thereof will be omitted.

Figure 4:
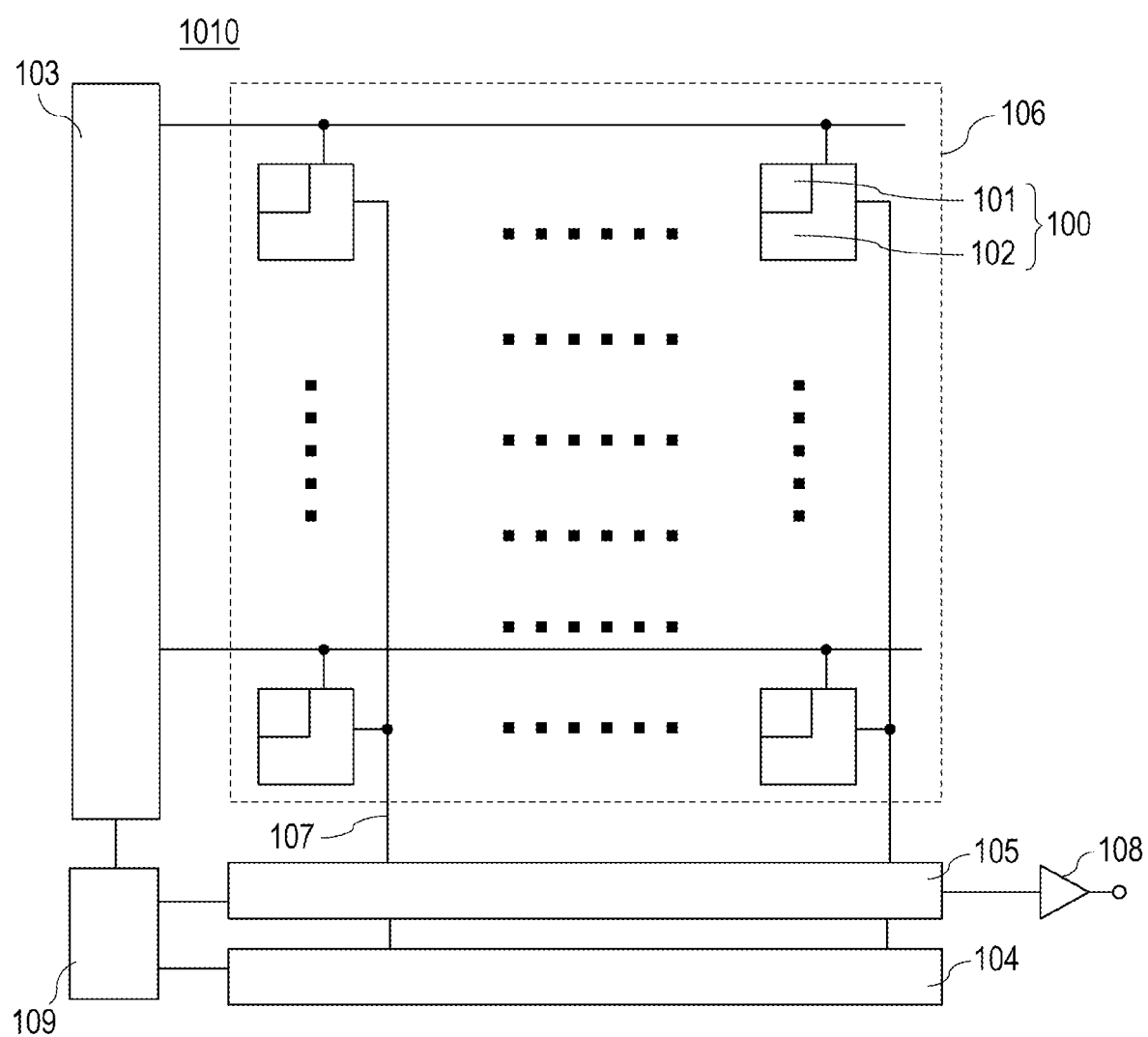
FIG. 4 is a block diagram illustrating a photodetection device.

FIG. 4 is a block diagram illustrating a photodetection device 1010 according to the present exemplary embodiment. The photodetection device 1010 includes a pixel unit 106, a control pulse generating unit 109, a horizontal scanning circuit unit 104, a column circuit 105, a signal line 107, and a vertical scanning circuit unit 103.

In the pixel unit 106, a plurality of pixels 100 is disposed in a matrix. One pixel 100 is composed of a photoelectric conversion element 101 and a pixel signal processing unit 102. The photoelectric conversion element 101 converts light into an electric signal. The pixel signal processing unit 102 outputs the converted electric signal to the column circuit 105.

The vertical scanning circuit unit 103 receives a control pulse supplied from the control pulse generating unit 109 and supplies the control pulse to each pixel 100. Logic circuits such as a shift register and an address decoder are used for the vertical scanning circuit unit 103.

The signal line 107 supplies a signal output from the pixel 100 selected by the vertical scanning circuit unit 103 as a potential signal to the circuit at the subsequent stage of the pixel 100.

The column circuit 105 receives the signals from each pixel 100 via the signal line 107 and performs predetermined processing. The predetermined processing is processing for performing noise removal or amplification on an input signal and converting the signal into a form to be output to the outside of a sensor. For example, the column circuit 105 includes a parallel-to-serial conversion circuit.

The horizontal scanning circuit unit 104 supplies the column circuit 105 with a control pulse for sequentially outputting the signal processed by the column circuit 105 to the output circuit 108.

The output circuit 108 is composed of a buffer amplifier, a differential amplifier, and the like, and outputs the signal output from the column circuit 105 to a recording unit or a signal processing unit outside the photodetection device 1010.

In FIG. 4, the pixels 100 in the pixel unit 106 may be arranged one-dimensionally, or the arrangement of the pixel unit 106 may be composed only of a single pixel. Further, the vertical scanning circuit unit 103, the horizontal scanning circuit unit 104, and the column circuit 105 may be arranged in each block obtained by dividing the pixel unit 106 into blocks of a plurality of pixel columns. Alternatively, the vertical scanning circuit unit 103, the horizontal scanning circuit unit 104, and the column circuit 105 may be arranged in each pixel column.

The function of the pixel signal processing unit 102 need not necessarily be provided for each pixel 100. For example, one pixel signal processing unit 102 may be shared by a plurality of pixels 100 and signal processing may be sequentially performed. In order to increase the aperture ratio of the photoelectric conversion element 101, the pixel signal processing unit 102 may be provided on a semiconductor substrate different from the photoelectric conversion element 101. In this case, the photoelectric conversion element 101 and the pixel signal processing unit 102 are electrically connected via a connection wiring provided for each pixel. The vertical scanning circuit unit 103, the horizontal scanning circuit unit 104, the signal line 107, and the column circuit 105 may also be provided on different semiconductor substrates as described above.

Figure 5:
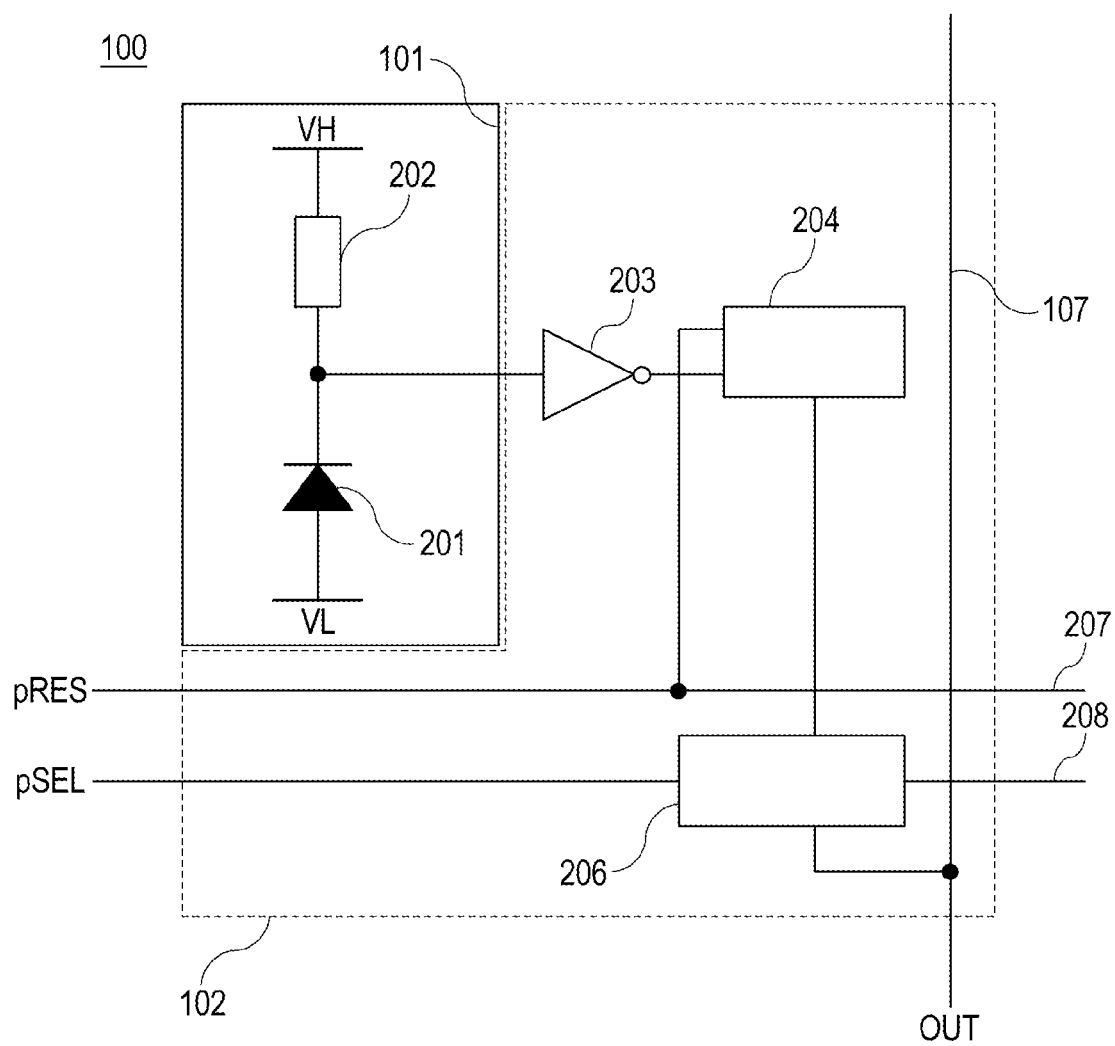
FIG. 5 is a block diagram illustrating a pixel including an equivalent circuit.

FIG. 5 illustrates an example of a block diagram of the pixel 100 including an equivalent circuit in the present exemplary embodiment. Referring to FIG. 5, one pixel 100 includes the photoelectric conversion element 101 and the pixel signal processing unit 102.

The photoelectric conversion element 101 includes a photoelectric conversion unit 201 and a control unit 202.

The photoelectric conversion unit 201 generates an electric charge pair corresponding to incident light by photoelectric conversion. An avalanche diode is used as the photoelectric conversion unit 201.

A potential based on a potential VH higher than a potential VL, which is supplied to an anode of the photoelectric conversion unit 201 is supplied to a cathode of the photoelectric conversion unit 201. A potential is supplied to the anode and the cathode of the photoelectric conversion unit 201 so that a reverse bias that allows the photoelectric conversion unit 201 to serve as an avalanche diode is applied. By performing photoelectric conversion with such a reverse bias potential being supplied, the electric charge generated by the incident light causes avalanche amplification and an avalanche current is generated.

In the case where the reverse bias potential is supplied, when the potential difference between the anode and the cathode is larger than the breakdown voltage, the avalanche diode operates in a Geiger mode. A photodiode that detects a weak signal at a single photon level at high speed using Geiger mode operation is a Single Photon Avalanche Diode (SPAD).

When the potential difference between the anode and the cathode of the photoelectric conversion unit 201 is equal to or more than the potential difference at which the electric charge generated in the photoelectric conversion unit 201 causes avalanche amplification and is equal to or less than the breakdown voltage, the avalanche diode is in a linear mode. An avalanche diode that performs light detection in the linear mode is called an avalanche diode (APD). In the present exemplary embodiment, the photoelectric conversion unit 201 may operate as either one of the avalanche diodes. The potential difference causing avalanche amplification will be described below.

The control unit 202 is connected to the photoelectric conversion unit 201 and a power supply voltage for supplying the high potential VH. The control unit 202 has a function for replacing a change in the avalanche current generated in the photoelectric conversion unit 201 with a voltage signal. Further, the control unit 202 functions as a load circuit (quench circuit) during signal amplification by avalanche amplification and has a function for suppressing avalanche amplification by suppressing a voltage to be supplied to the photoelectric conversion unit 201 (quenching operation). As the control unit 202, for example, a resistive element or an active quench circuit which actively suppresses avalanche amplification by performing feedback control while detecting an increase in avalanche current is used.

The pixel signal processing unit 102 includes a waveform shaping unit 203, a counter circuit 209, and a selection circuit 206. The waveform shaping unit 203 shapes the voltage change obtained at the time of detecting a photon-level signal, and outputs a pulse signal. As the waveform shaping unit 203, for example, an inverter circuit is used. Although an example using one inverter as the waveform shaping unit 203 is illustrated, a circuit in which a plurality of inverters is connected in series may be used, or another circuit having a waveform shaping effect may be used.

The pulse signal output from the waveform shaping unit 203 is counted by the counter circuit 209. For example, in the case of using an N-bit counter (N: a positive integer), the counter circuit 209 can count the pulse signal of a single photon up to the N-th power of about 2 at maximum. The counted signal is held as the detected signal. Further, when a control pulse pRES is supplied through a drive line 207, the detected signal held in the counter circuit 209 is reset.

A control pulse pSEL is supplied to the selection circuit 206 from the vertical scanning circuit unit 103 illustrated in FIG. 4 through a drive line 208, and switches the electrical connection and disconnection between the counter circuit 209 and the signal line 107. As the selection circuit 206, for example, a transistor or a buffer circuit for outputting a signal to the outside of the pixel is used.

A switch such as a transistor may be provided between the control unit 202 and the photoelectric conversion unit 201 or between the photoelectric conversion element 101 and the pixel signal processing unit 102 to switch the electrical connection. Similarly, the supply of the high potential VH to be supplied to the control unit 202 or the low potential VL to be supplied to the photoelectric conversion element 101 may be electrically switched by using a switch such as a transistor.

In the pixel unit 106 in which the plurality of pixels 100 is disposed in a matrix form, a captured image may be acquired by a rolling shutter operation in which counting of the counter circuit 209 is sequentially reset for each row and the detected signals held in the counter circuit 209 are sequentially output for each row.

Alternatively, a captured image may be acquired by a global electronic shutter operation in which counting of the counter circuit 209 in all pixel rows is reset simultaneously and the detected signals held in the counter circuit 209 are sequentially output for each row. When the global electronic shutter operation is performed, a unit for switching the counter circuit 209 between a counting operation and non-counting operation may be provided. The unit for switching is, for example, the switch described above.

The present exemplary embodiment illustrates a configuration in which a captured image is acquired using the counter circuit 209. However, instead of using the counter circuit 209, the photodetection device 1010 that acquires a pulse detection timing using a time-to-digital converter (TDC) and a memory may be used.

In this case, the generation timing of the pulse signal output from the waveform shaping unit 203 is converted into a digital signal by TDC. A control pulse pREF (reference signal) is supplied to the TDC from the vertical scanning circuit unit 103 illustrated in FIG. 4 through a drive line to measure the timing of the pulse signal. Based on the control pulse pREF, the TDC acquires, as a digital signal, a signal obtained when the input timing of the signal output from each pixel through the waveform shaping unit 203 is set as a relative time.

For the TDC circuit, for example, a Delay Line method in which buffer circuits are connected in series to create a delay, a Looped TDC method in which a Delay Line is connected in a loop, and the like are used. Other methods may be used, but it is preferable to use a circuit system that can achieve time resolution equal to or higher than the time resolution of the photoelectric conversion unit 201.

The digital signal representing the pulse detection timing obtained by the TDC is held in one or more memories. When a plurality of memories is disposed, a plurality of signals is supplied to the selection circuit 206, thereby enabling control of the output to the signal line 107 for each memory in the case of outputting the digital signal held in the memory to the signal line 107.

Figure 6:
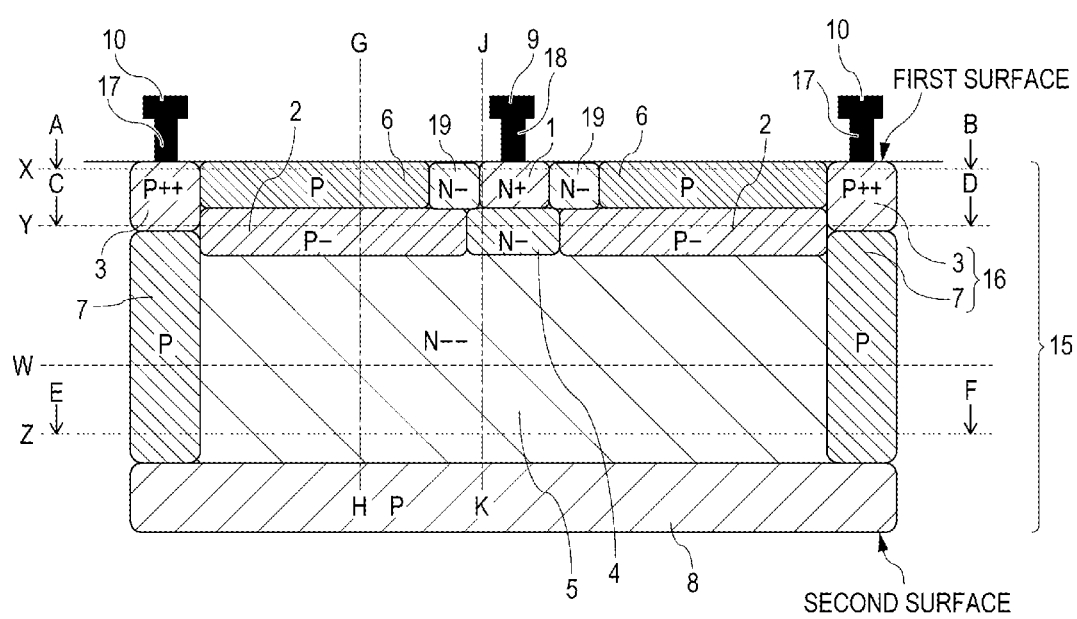
FIG. 6 is a schematic sectional view according to a first exemplary embodiment.

A schematic sectional view and a schematic plan view according to the first exemplary embodiment based on the idea will be described with reference to FIGS. 6 to 7C. Referring to FIG. 6, in a region where the first semiconductor region 71 illustrated in FIG. 1 is disposed, a N-type semiconductor region 1 is disposed, and in a region where a second semiconductor region 76 illustrated in FIG. 1 is disposed, a P-type semiconductor region 6 is disposed. In FIG. 6, an N-type semiconductor region 4 is disposed in a region where the third semiconductor region 74 illustrated in FIG. 1 is disposed, and in a region where the fourth semiconductor region 72 illustrated in FIG. 1 is disposed, a P-type semiconductor region 2 are arranged. Referring to FIG. 6, in a region where the fifth semiconductor region 75 illustrated in FIG. 1 is disposed, an N-type semiconductor region 5 is disposed.

Referring first to FIG. 6, a cross-sectional structure of the photoelectric conversion region sandwiched between the separation portion 16 and the separation portion 16 will be described.

The separation portion 16 is constituted by a P-type semiconductor region arranged in the depth direction from the first surface. Specifically, as the separation portion 16, a P-type semiconductor region 3 and a P-type semiconductor region 7 are arranged in this order from the first surface in the depth direction and are in contact with each other. The P-type semiconductor region 3 is electrically connected to the P-type semiconductor region 7, a P-type semiconductor region 8, the P-type semiconductor region 2, and the P-type semiconductor region 6.

The impurity concentration of the P-type semiconductor region 3 is higher than the impurity concentration of each of the P-type semiconductor region 6, the P-type semiconductor region 7, the P-type semiconductor region 8, and the P-type semiconductor region 2. This configuration makes it possible to lower the contact resistance when the P-type semiconductor region 3 and a contact plug 17 are connected, rather than when the P-type semiconductor region 7 and the contact plug 17 are connected. For example, the impurity concentration of the P-type semiconductor region 3 can be set to about $1 \times 10^{19}$ to $10^{20}$ cm$^{-3}$.

The N-type semiconductor region 1 is a region having a higher impurity concentration than the N-type semiconductor region 4 and the N-type semiconductor region 5 to be described below. For example, the impurity concentration of the N-type semiconductor region 1 is equal to or more than $6 \times 10^{18}$, and a potential which is reverse biased to the separation portion 16 is supplied to the N-type semiconductor region 1.

The impurity concentration of the N-type semiconductor region 4 is lower than the impurity concentration of the N-type semiconductor region 1. For example, the impurity concentration of the N-type semiconductor region 4 can be set to $1 \times 10^{17}$ or less. As a result, electric charge in the vicinity of the N-type semiconductor region 4 can easily move to the N-type semiconductor region 1.

The impurity concentration of the P-type semiconductor region 6 is higher than the impurity concentration of the P-type semiconductor region 2. For example, the impurity concentration of the P-type semiconductor region 6 can be set to about $1 \times 10^{18}$ to $5 \times 10^{18}$ cm$^{-3}$ and the impurity concentration of the P-type semiconductor region 2 can be set to about $5 \times 10^{17}$ to $1 \times 10^{18}$ cm$^{-3}$. As a result, the electric charge photoelectrically converted in the P-type semiconductor region 6 can easily move to the N-type semiconductor region 5 through the P-type semiconductor region 2.

An N-type semiconductor region 19 has an impurity concentration lower than that of the N-type semiconductor region 1. For example, the impurity concentration of the N-type semiconductor region 19 can be set to about $1 \times 10^{17}$ to $10^{18}$ cm$^{-3}$. This configuration makes it possible to relax a high electric field generated between the N-type semiconductor region 1 and the P-type semiconductor region 6, and to suppress avalanche amplification of electric charge between the N-type semiconductor region 1 and the P-type semiconductor region 6.

The impurity concentration of the P-type semiconductor region 2 is lower than the impurity concentration of the P-type semiconductor region 7. The P-type semiconductor region 2 and the N-type semiconductor region 4 form a PN junction. By this PN junction, the entire N-type semiconductor region 4 becomes a depletion layer region. Further, this depletion layer region extends to a partial region of the N-type semiconductor region 1. A strong electric field is induced in the extending depletion layer region. When electrons move to the depletion layer region extending to a partial region of the N-type semiconductor region 1 due to this strong electric field, avalanche amplification occurs and a current based on the amplified electric charge is output from a wiring 9 through a contact plug 18. That is, in the present exemplary embodiment, the photodetection region is a depletion layer region in a part of the N-type semiconductor region 1.

In the present exemplary embodiment, the reason why the N-type semiconductor region 4 is not a P-type region but an N-type region is that electric charge can be acquired from a deeper portion by deeply extending the depletion layer to a deep part of the N-type semiconductor region 5.

Further, the impurity concentration of each of the N-type semiconductor region 1, the N-type semiconductor region 4, and the P-type semiconductor region 2 is set to an impurity concentration at which the entire N-type semiconductor region 1 is not depleted when a potential difference causing avalanche amplification in a depletion layer region generated in a part of the N-type semiconductor region 1 is supplied. This is because when the depletion layer region is expanded so as to come into contact with the first surface of the semiconductor substrate 15, noise may be generated on the first surface of the semiconductor substrate 15. On the other hand, the impurity concentration is set so that the entire N-type semiconductor region 4 is depleted.

The condition that the entire N-type semiconductor region 4 is depleted is expressed in Expression 1. Assume herein that the impurity concentration of the N-type semiconductor region 4 is represented by an impurity concentration Nd, the impurity concentration of the P-type semiconductor region 2 is represented by an impurity concentration Na, and the elementary quantity is represented by an elementary quantity q. Further, assume that the dielectric constant of semiconductor is represented by a dielectric constant E, the potential difference between the PN junction of the N-type semiconductor region 4 and the PN junction of the P-type semiconductor region 2 is represented by a potential difference V, and the length of the N-type semiconductor region 4 sandwiched between the P-type semiconductor regions 2 is represented by a length D.

[Mathematical Formula 1]

$$2 \times \sqrt{\frac{2\varepsilon\, NaV}{qNd(Nd + Na)}} > D \quad \text{(Expression 1)}$$

The impurity concentration at which the entire N-type semiconductor region 1 is not depleted is set to, for example, an impurity concentration of the N-type semiconductor region 1 of $6.0 \times 10^{18}$ [atms/cm$^3$] or more. In this case, the impurity concentration satisfying these depletion conditions is an impurity concentration of the P-type semiconductor region 2 of $1.0 \times 10^{16}$ [atms/cm$^3$] or more. Further, the impurity concentration of the N-type semiconductor region 4 is $1.0 \times 10^{17}$ [atms/cm$^3$] or less. However, the impurity concentration is not limited to these examples.

Then, the potential difference between the N-type semiconductor region 1 and the separation portion 16 is set so that the electric field in the depth direction induced in the depletion layer becomes sufficiently large. The potential difference which becomes sufficiently large is the potential difference at which the electric charge influenced by the electric field causes avalanche amplification. That is, the potential difference is a potential difference between the N-type semiconductor region 1 and the P-type semiconductor region 3 which realizes the operation as the avalanche diode (APD or SPAD) by the photodetection element of this structure.

Specifically, the potential difference between the N-type semiconductor region 1 and the P-type semiconductor region 2 is 6 V or more. In this case, as described above, the entire N-type semiconductor region 4 electrically connected to the N-type semiconductor region 1 becomes a depletion layer region, and a strong electric field that causes avalanche amplification is generated in the depletion layer region extending to a partial region of the N-type semiconductor region 1.

More preferably, the potential difference between the N-type semiconductor region 1 and the P-type semiconductor region 3 is 10 V or more and 30 V or less. In this case, for example, a potential of 10 V or higher is supplied to the N-type semiconductor region 1 and a potential of 0 V or lower is supplied to the P-type semiconductor region 3. However, when the potential difference is 6 V or more, the potential is not limited to these values.

Incidentally, in the present exemplary embodiment, electric charge is generated in the N-type semiconductor region 5, and is collected and read out by the N-type semiconductor region 1. That is, the electric charge generated in the semiconductor region of the first conductivity type is read out from the semiconductor region of the first conductivity type.

In addition, the electric charge generated by photoelectric conversion in the P-type semiconductor region 6 and the P-type semiconductor region 2 can also be collected and read out by the N-type semiconductor region 1 through the N-type semiconductor region 5 and the N-type semiconductor region 4.

On the other hand, the device described in the specification of U.S. Pat. No. 9,209,336 performs avalanche amplification of electric charge generated in the N-type epitaxial layer 2 at the interface between the N-type epitaxial layer 2 and the p-type anode region 14, and the electric charge is read out from the p-type anode region 14. That is, the electric charge generated in the semiconductor region of the first conductivity type is read out from the semiconductor region of the second conductivity type. Also in this respect, the present exemplary embodiment is different from the device described in the specification of U.S. Pat. No. 9,209,336.

In FIG. 6, assume that the N-type semiconductor region 5 having an impurity concentration lower than that of the N-type semiconductor region 1 is disposed immediately below the N-type semiconductor region 1 having a high impurity concentration, without providing the P-type semiconductor region 2 and the N-type semiconductor region 4. In this case, it is possible to generate electric charge in the N-type semiconductor region 5 and to read out the electric charge from the N-type semiconductor region 1, but it is difficult to perform avalanche amplification under the same voltage condition as that in the present exemplary embodiment. This is because most part of the potential difference applied between the N-type semiconductor region 1 and the P-type semiconductor region 3 is applied to the depletion layer region of the N-type semiconductor region 5, so that the potential difference applied to the avalanche amplification region in the vicinity of the N-type semiconductor region 1 becomes small. On the other hand, in the present exemplary embodiment, since the N-type semiconductor region 5 is surrounded by the P-type semiconductor region in each orientation excluding the part in contact with the N-type semiconductor region 4, the potential of the N-type semiconductor region 5 is closer to the surrounding P-type semiconductor region than the potential of the N-type semiconductor region 1 is. That is, by suppressing excessive expansion of the depletion layer to the deep portion of the substrate in the P-type semiconductor region 2, it is possible to concentrate most of the above-described applied potential difference in the avalanche amplification region in the vicinity of the N-type semiconductor region 1. As a result, the photoelectric charge can be avalanche-amplified at a lower voltage.

The impurity concentration of the N-type semiconductor region 5 is equal to or less than the impurity concentration of the N-type semiconductor region 4. At least the impurity concentration of the N-type semiconductor region 5 may be less than the impurity concentration of the N-type semiconductor region 1.

FIG. 6 illustrates an example of the N-type semiconductor region 5 as a region having the same impurity concentration. However, the N-type semiconductor region 5 may have a gradient of the impurity concentration so as to have a potential structure in which the electric charge moves toward the first surface of the semiconductor substrate 15. Setting such a gradient of the impurity concentration facilitates transfer of electric charge to the N-type semiconductor region 1.

In the case where the semiconductor substrate 15 has a gradient of the impurity concentration so as to have a potential structure in which the electric charge moves toward the first surface of the semiconductor substrate 15, the first surface may be an N-type semiconductor region and the second surface may be a P-type semiconductor region in the region where the N-type semiconductor region 5 is disposed.

Alternatively, a P-type semiconductor region having an impurity concentration lower than the impurity concentration of the P-type semiconductor region 2 may be disposed instead of the N-type semiconductor region 5. Also, in this case, the semiconductor substrate 15 may have a gradient of the impurity concentration so as to have a potential structure in which the electric charge moves toward the first surface of the semiconductor substrate 15.

For example, the P-type semiconductor region includes a first region, a second region disposed at a position deeper than the first region with respect to the first surface, and a third region disposed at a position deeper than the second region with respect to the first surface. Assuming that the first region has a first impurity concentration, the second region has a second impurity concentration, and the third region has a third impurity concentration, the first impurity concentration<the second impurity concentration<the third impurity concentration may be set. The first impurity concentration is lower than the impurity concentration of the P-type semiconductor region 2. In this case, the P-type semiconductor region disposed instead of the N-type semiconductor region 5 is divided into three regions. However, the semiconductor region is not limited to this example.

The P-type semiconductor region 8 is disposed at a position deeper than the N-type semiconductor region 5 and defines the depth of the photoelectric conversion region. The N-type semiconductor region 5 forms a PN junction with each of the P-type semiconductor region 2, the P-type semiconductor region 7, and the P-type semiconductor region 8. The impurity concentration of the P-type semiconductor region 8 is set to be higher than the impurity concentration of the P-type semiconductor region 2. As a result, electric charge generated in the vicinity of the P-type semiconductor region 8 can easily move in the direction of the first surface.

The contact plug 18 is connected to the N-type semiconductor region 1, and the wiring 9 is connected to the contact plug 18. A contact plug 17 is connected to the P-type semiconductor region 3, and a wiring 10 is connected to the contact plug 17. The wiring 9 or the wiring 10 is connected to the control unit 202 such as a resistive element for performing a quenching operation. The following description is made assuming that the control unit 202 is connected to the wiring 9.

FIG. 6 is illustrated assuming that the contact plug 17 and the wiring 10 are disposed on the first surface. However, the contact plug 17 and the wiring 10 may be disposed on the second surface.

In the case where the contact plug 17 and the wiring 10 are disposed on the second surface, the impurity concentration of the region of the P-type semiconductor region 8 where the contact plug 17 is disposed may be higher than the impurity concentration of the P-type semiconductor region 7. That is, the P-type semiconductor region 3 is obtained. In this case, the contact plug 17 is not connected to the P-type semiconductor region 3 disposed on the first surface. Therefore, when the concentration of the P-type impurity in the P-type semiconductor region 7 is higher than that in the P-type semiconductor region 6, the impurity concentration of the P-type semiconductor region 3 may be set to be about the same as the impurity concentration of the P-type semiconductor region 7.

Also, in the case where the separation portion 16 includes an insulating separation portion on the first surface, the contact plug 17 and the wiring 10 are disposed on the second surface. In this case, the separation portion 16 is disposed in contact with the insulating separation portion, the P-type semiconductor region 7, and the P-type semiconductor region 3 in the depth direction from the first surface so as to overlap the insulating separation portion, the P-type semiconductor region 7, and the P-type semiconductor region 3 in this order.

Figure 7A:
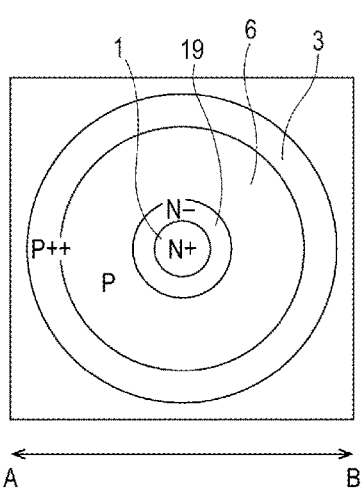
FIGS. 7A to 7C are schematic plan views according to the first exemplary embodiment.
Figure 7B:
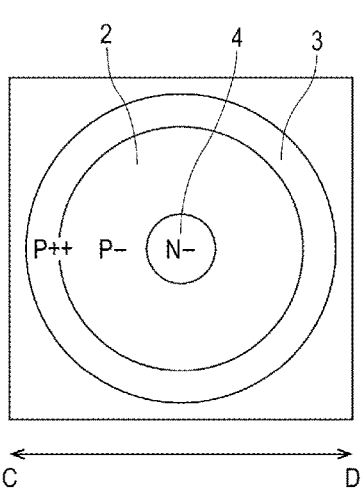

Next, with reference to FIGS. 7A to 7C, the planar structure of the photoelectric conversion region sandwiched between the separation portion 16 and the separation portion 16 at an arbitrary depth in the sectional structure illustrated in FIG. 6 will be described. In FIGS. 7A to 7C, the boundary of each semiconductor region is depicted as a circle. However, the boundary of each semiconductor region is not limited to this shape.

FIG. 7A is a schematic plan view taken along a line segment AB at the depth X illustrated in FIG. 6. The N-type semiconductor region 1 is included in the N-type semiconductor region 19. In addition, the N-type semiconductor region 19 is included in the P-type semiconductor region 6, and the P-type semiconductor region 6 is included in the P-type semiconductor region 3. The area of the P-type semiconductor region 6 is larger than the area of the N-type semiconductor region 1.

FIG. 7B illustrates a schematic plan view taken along a line segment CD at the depth Y illustrated in FIG. 6. The N-type semiconductor region 4 is included in the P-type semiconductor region 2. The P-type semiconductor region 2 is included in the P-type semiconductor region 3.

Figure 7C:
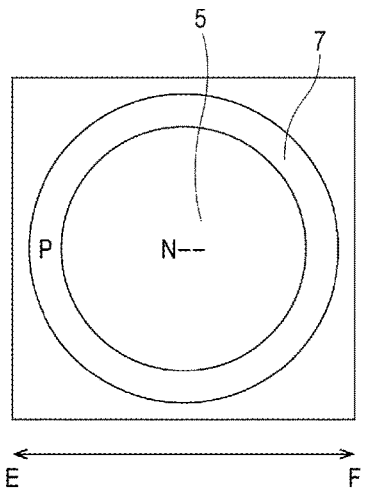

FIG. 7C illustrates a schematic plan view taken along a line segment EF at the depth Z illustrated in FIG. 6. The N-type semiconductor region 5 is included in the P-type semiconductor region 7. When FIGS. 7B and 7C are superimposed, the N-type semiconductor region 4 and the P-type semiconductor region 2 overlap the N-type semiconductor region 5 in a plan view.

When FIGS. 7A and 7B are superimposed, the N-type semiconductor region 1 overlaps at least a part of the N-type semiconductor region 4 in a plan view, and the P-type semiconductor region 6 overlaps at least a part of the P-type semiconductor region 2.

This configuration makes it possible to realize the photodetection device in which the area of the electric charge detection region is minimized and the amount of collected electric charge generated by photoelectric conversion of light including light having a short wavelength in the electric charge detection region is increased.

Next, a method of manufacturing the avalanche diode illustrated in the schematic cross-sectional view of FIG. 6 will be described with reference to FIGS. 8A to 8F. The order of processes, the order of which is not particularly described, may be changed as appropriate. Further, known manufacturing methods can be applied to the processes, the descriptions of which are omitted in FIGS. 8A to 8F.

Figure 8A:
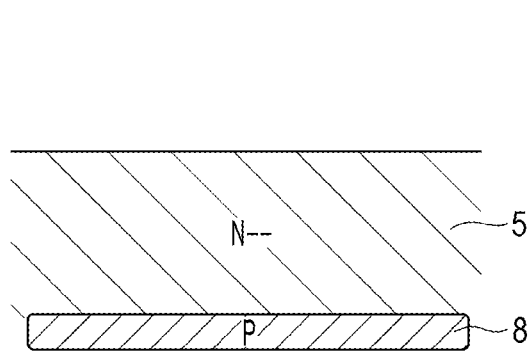
FIGS. 8A to 8F each illustrate a manufacturing method according to the first exemplary embodiment.

As illustrated in FIG. 8A, P-type impurity ion implantation (hereinafter referred to as ion implantation) is performed on the region, which becomes the N-type semiconductor region 5, from the normal direction to the first surface of the semiconductor substrate 15. Thus, the P-type semiconductor region 8 is formed at a deeper position relative to the first surface of the semiconductor substrate 15.

Figure 8B:
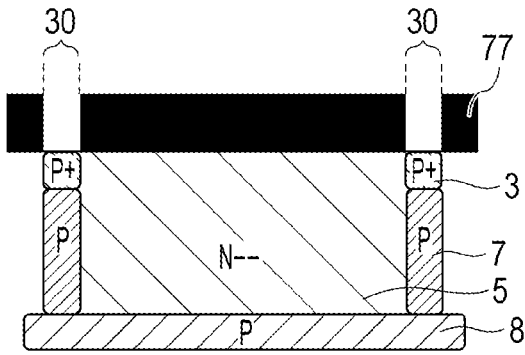

Next, as illustrated in FIG. 8B, a mask 77 is formed on the first surface of the semiconductor substrate 15. The mask 77 has an opening 30. Then, P-type ion implantation is performed from the normal direction to the first surface of the semiconductor substrate 15, thereby forming the P-type semiconductor region 3 and the P-type semiconductor region 7 in this order from the first surface. In this case, the P-type semiconductor region 7 and a part of the P-type semiconductor region 8 are connected. Further, impurity concentration of the P-type semiconductor region 3 is set to be higher than the impurity concentration of the P-type semiconductor region 7. Specifically, for example, there is a method of performing ion implantation a plurality of times with different ion implantation energies.

Figure 8C:
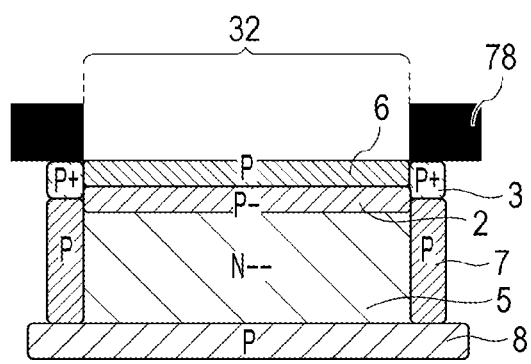

Next, the mask 77 is removed and a mask 78 is disposed. The mask 78 has an opening 32. Then, as illustrated in FIG. 8C, P-type ion implantation is performed from a direction parallel to the normal direction to the first surface of the semiconductor substrate 15, thereby forming a region that becomes the P-type semiconductor region 2. After that, P-type ion implantation is similarly performed at a shallower position relative to the first surface than the position where P-type ion implantation is performed to form the region that becomes the P-type semiconductor region 2, thereby forming the P-type semiconductor region 6. In this case, the region that becomes the P-type semiconductor region 6 is formed after forming the region that becomes the P-type semiconductor region 2. However, the order of forming the regions may be reversed.

Figure 8D:
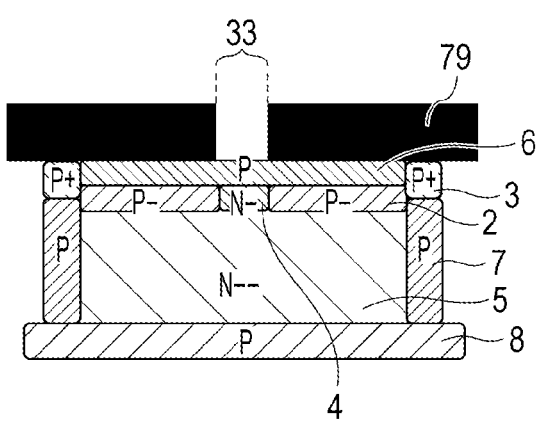
Figure 8E:
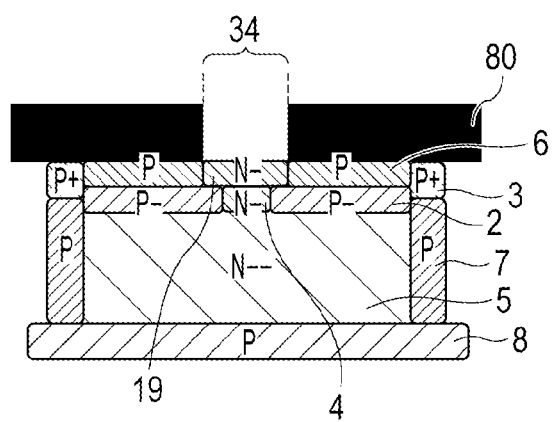

Next, the mask 78 is removed and a mask 79 is disposed. The mask 79 has an opening 33. As illustrated in FIG. 8D, N-type ion implantation is performed at a depth where the region that becomes the P-type semiconductor region 2 is disposed from a direction parallel to the normal direction to the first surface of the semiconductor substrate 15, thereby forming the N-type semiconductor region 4 in a part of the region that becomes the P-type semiconductor region 2.

Next, the mask 79 is removed and a mask 80 is disposed. The mask 80 has an opening 34. The N-type semiconductor region 19 is formed by performing N-type ion implantation on the first surface of the semiconductor substrate 15 from a direction parallel to the normal direction to the first surface of the semiconductor substrate 15. In this case, the N-type semiconductor region 4 is formed first, but instead the N-type semiconductor region 19 may be formed first.

Next, the mask 80 is removed and a mask 81 is disposed. The mask 81 has an opening 35. The N-type semiconductor region 1 is formed by performing N-type ion implantation on the first surface of the semiconductor substrate 15 from a direction parallel to the normal direction to the first surface of the semiconductor substrate 15. In this case, although the N-type semiconductor region 19 is formed first, but instead the N-type semiconductor region 1 may be formed first.

Impurity ions having different thermal diffusion coefficients may be used as impurity ions to be implanted to form the N-type semiconductor region 1, the N-type semiconductor region 4, and the N-type semiconductor region 19. According to this configuration, the degree of freedom of the potential design in the region where the N-type semiconductor region 1, the N-type semiconductor region 4, and the N-type semiconductor region 19 are arranged is improved.

Figure 8F:
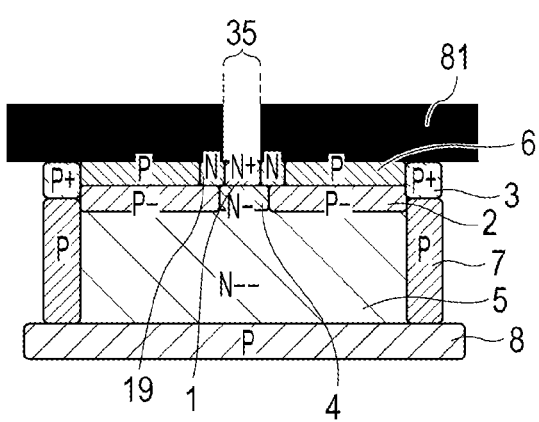

Further, the N-type semiconductor region 4 may be formed in the process illustrated in FIG. 8F without performing the process illustrated in FIG. 8D. In that case, the diffusion of impurity ions in a direction parallel to the first surface in the N-type semiconductor region 4, which is formed by performing ion implantation at a deeper position relative to the first surface, is greater than that in the N-type semiconductor region 1 which is formed by performing ion implantation at a shallower position relative to the first surface which is an incident surface. As a result, the N-type semiconductor region 1 is included in the N-type semiconductor region 4 in a plan view. Further, since the N-type semiconductor region 1 and the N-type semiconductor region 4 are formed using the same mask, it is possible to suppress a positional misalignment of both semiconductor regions, and it is possible to suppress a tunneling effect which can be caused by the positional misalignment.

This configuration makes it possible to reduce the noise charge caused by the tunneling effect without deteriorating the sensitivity characteristic as compared with the configuration in which the avalanche breakdown occurs in the entire avalanche diode as discussed in U.S. Pat. No. 9,209,336. Further, the electric charge photoelectrically converted at the depths X to Y flows into the N-type semiconductor region 5 due to the potential gradient, passes through the N-type semiconductor region 4, and is subjected to avalanche amplification in the vicinity of the N-type semiconductor region 1, so that the electric charge can be counted as a signal. That is, the electric charge photoelectrically converted at a shallower portion of the substrate can also be detected as sensitivity.

Figure 9A:
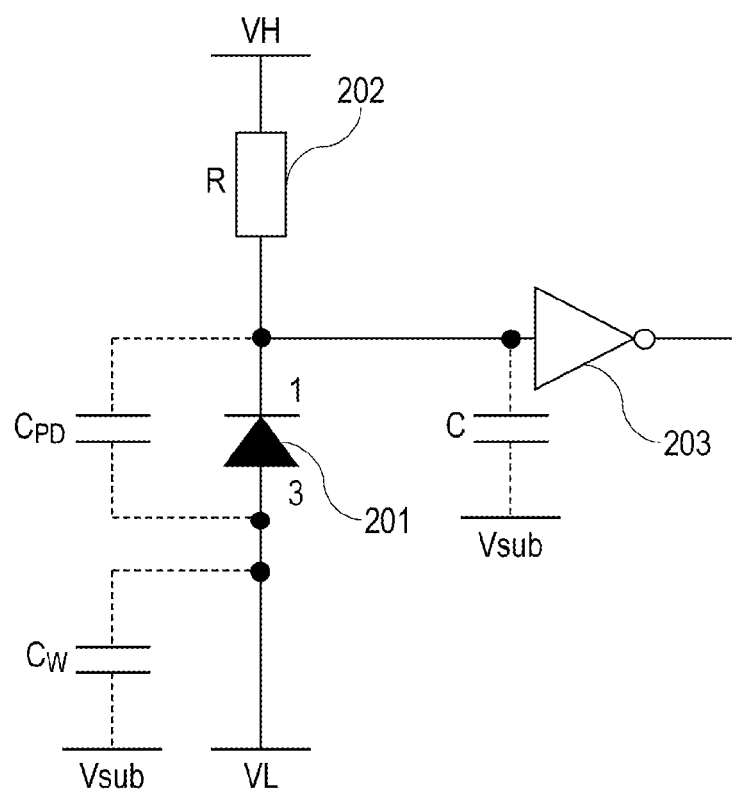
FIGS. 9A and 9B are equivalent circuit diagrams.

Next, the control unit 202 of the present exemplary embodiment will be described with reference to FIGS. 9A and 9B. In the present exemplary embodiment, the control unit 202 has two configurations. In the first configuration, as illustrated in FIG. 9A, the control unit 202 is disposed on the cathode side to which the high potential VH of the photoelectric conversion unit 201 is supplied. In the second configuration, as illustrated in FIG. 9B, the control unit 202 is disposed on the anode side to which the low potential VL of the photoelectric conversion unit 201 is supplied.

Figure 9B:
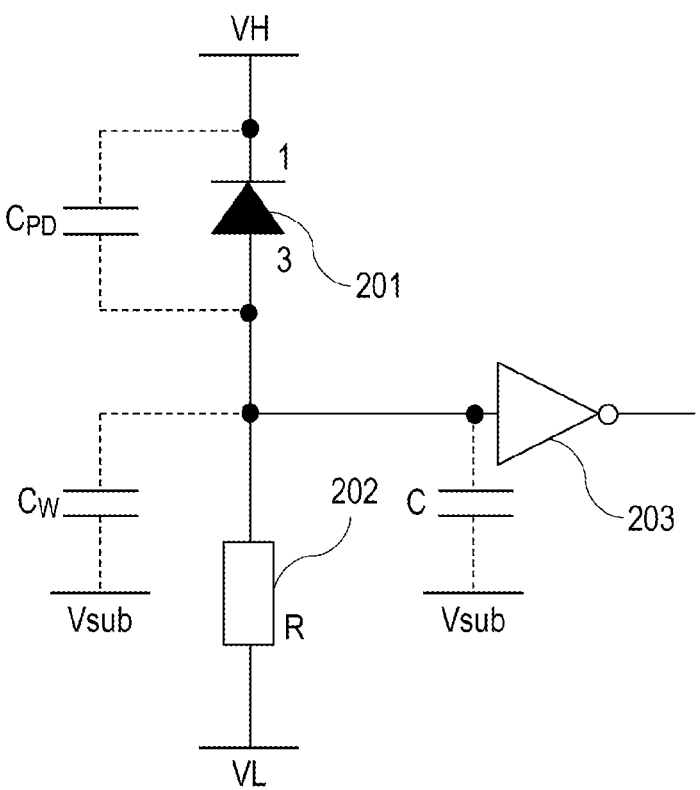

In the configurations illustrated in FIGS. 9A and 9B, a certain period of time is required for the voltage of the control unit 202 to return to the bias in the initial state of the photoelectric conversion unit 201 due to a voltage drop after the input potential of the waveform shaping unit 203 is changed by the avalanche current. In this way, the period from the detection of the electric charge once to the return to the bias state where the electric charge can be detected next is called a dead time. As the dead time becomes shorter, the number of electric charges that can be counted per hour increases and the dynamic range of the photodetection device becomes larger.

For example, when the control unit 202 is a resistive element, a dead time ($\tau d$ [s]) of the avalanche diode according to the present exemplary embodiment is determined by the product of a resistance (R [$\Omega$]) and a capacitance (C [F]) of the input terminal. In the following expression, the PN junction capacitance of the photoelectric conversion unit 201 is represented by Cpd, the capacitance of the well of the photoelectric conversion unit 201 is represented by Cw, and the parasitic capacitance of the wiring/diffusion layer is represented by C.

In the case of FIG. 9A, the dead time is obtained by Expression 2.

$$\tau d = R(Cpd + C) \quad \text{(Expression 2)}$$

In the case of FIG. 9B, the dead time is obtained by Expression 3.

$$\tau d = R(Cpd + Cw + C) \quad \text{(Expression 3)}$$

The PN junction capacitance Cpd of the photoelectric conversion unit 201 corresponds to the PN junction capacitance of the photodetection region that induces a strong electric field to cause avalanche amplification. Therefore, the PN junction capacitance Cpd changes in proportion to the area of the photodetection region. That is, when the area of the photodetection region is increased in order to increase the light detection efficiency, the PN junction capacitance Cpd increases and the dead time increases. As a result, the dynamic range is lowered.

In other words, the light detection efficiency and the dynamic range are in a trade-off relationship. On the other hand, according to the pixel structure of the present exemplary embodiment, it is possible to reduce the area of the photodetection region while securing a large area of the photoelectric conversion region. Therefore, it is possible to reduce the PN junction capacitance Cpd and reduce the dead time. As a result, it is possible to achieve both a high light detection efficiency and a high dynamic range.

The effect of improving the dynamic range due to the pixel structure of the present exemplary embodiment appears more remarkably in the configuration illustrated in FIG. 9A than in FIG. 9B. For example, when the ratio of Cpd of the SPAD structure according to the present exemplary embodiment to the SPAD structure of the related art is represented by A ($0 < A < 1$), improvement rates $\Delta$ of the dynamic range in each of the circuit systems of FIGS. 9A and 9B are represented by Expressions 4 and 5, respectively.

$$\Delta 1 = (1-A)Cpd/(ACpd+C) \quad \text{(Expression 4)}$$

$$\Delta 2 = (1-A)Cpd/(ACpd+Cw+C) \quad \text{(Expression 5)}$$

The calculations in Expressions 4 and 5 are performed using the fact that the dynamic range is inversely proportional to the dead time. From the above Expression, it is understood that Δ1>Δ2 is always satisfied.

In view of the above, when FIGS. 9A and 9B are applied in the configuration of the present exemplary embodiment, the improvement rate of the dynamic range in FIG. 9A is higher than that in FIG. 9B in principle.

While the control unit 202 has been described as a resistive element, the same holds true when the control unit 202 is an active quenching circuit.

In view of the above, it is possible to increase the dynamic range improvement effect when the control unit 202 for each pixel according to the present exemplary embodiment is disposed on the cathode side of the photoelectric conversion unit 201, rather than when the control unit 202 is disposed on the anode side of the photoelectric conversion unit 201.

According to the configuration of the present exemplary embodiment, the formation of a path through which electric charge moves makes it possible to suppress a deterioration in the light detection efficiency. In other words, it is possible to reduce noise while suppressing a deterioration in light detection efficiency.

Second Exemplary Embodiment

Figure 10:
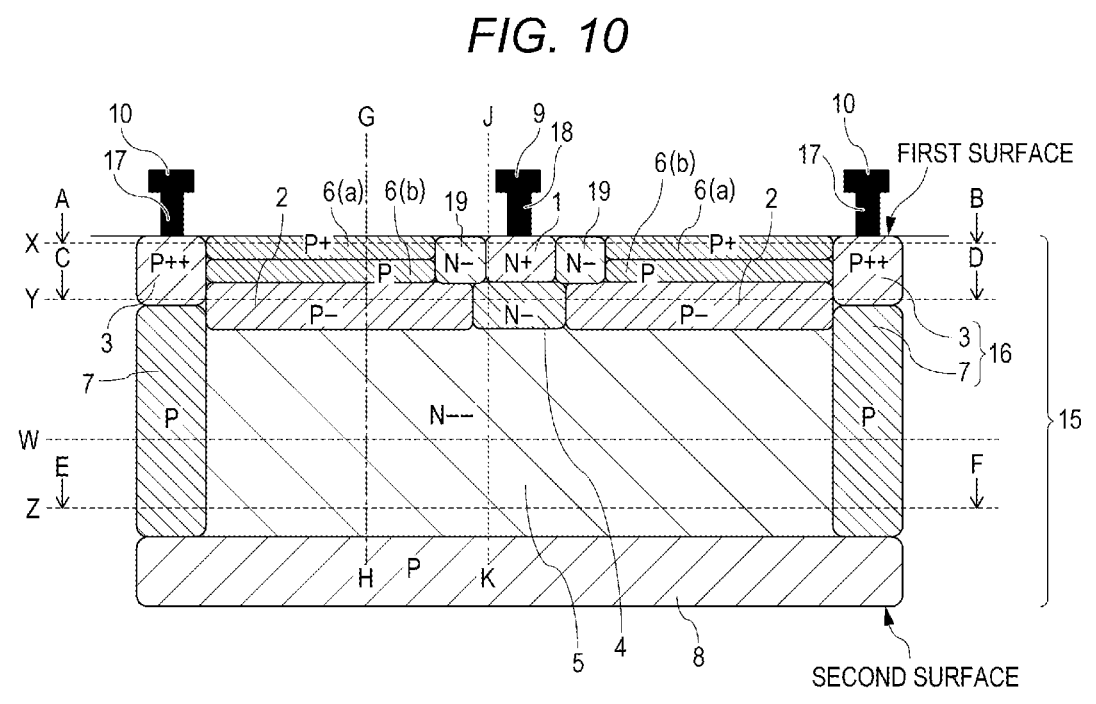

FIG. 10 is a cross-sectional view according to a second exemplary embodiment based on the idea. Portions having functions similar to those illustrated in FIGS. 1 to 8F are denoted by the same reference numerals, and detailed descriptions thereof will be omitted. The P-type semiconductor region 6 illustrated in FIG. 10 differs from the P-type semiconductor region 6 illustrated in FIG. 6 in that the P-type semiconductor region 6 is composed of a P-type semiconductor region 6(a) and a P-type semiconductor region 6(b) which have different impurity concentrations.

In FIG. 10, the P-type semiconductor region 6(a) has a higher impurity concentration (lower N-type impurity concentration) than that of the P-type semiconductor region 6(b). Further, the P-type semiconductor region 6(b) has a higher impurity concentration (lower N-type impurity concentration) than that of the P-type semiconductor region 2. Thus, the potential gradient from the depth X to the depth Y of the line segment GH illustrated in FIG. 3 becomes larger, and the electric charge photoelectrically converted between the depths X and Y easily flows into the N-type semiconductor region 5. As a result, the sensitivity on a short wavelength side is improved as compared with the structure of the first exemplary embodiment.

Third Exemplary Embodiment

Figure 11:
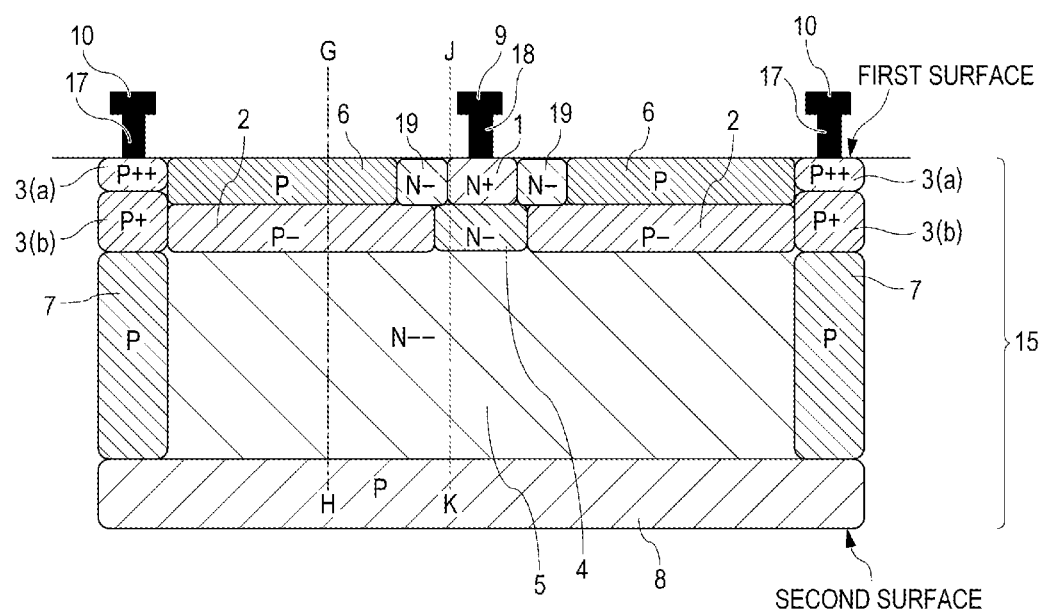
FIG. 11 is a schematic sectional view according to a third exemplary embodiment.

FIG. 11 is a cross-sectional view of a third exemplary embodiment based on the idea. Portions having functions similar to those illustrated in FIGS. 1 to 8F are denoted by the same reference numerals, and detailed descriptions thereof will be omitted. The P-type semiconductor region 3 illustrated in FIG. 11 differs from the P-type semiconductor region 3 illustrated in FIG. 6 in that the P-type semiconductor region 3 is composed of a P-type semiconductor region 3(a) and a P-type semiconductor region 3(b) which have different impurity concentrations.

In FIG. 11, the P-type semiconductor region 3(a) has a higher impurity concentration than that of the P-type semiconductor region 3(b). In FIG. 6, the P-type semiconductor region 3 is necessary for lowering the contact resistance between the contact plug 17 and the substrate. At the same time, the P-type semiconductor region 3 is necessary for preventing contamination of the electric charge photoelectrically converted in the P-type semiconductor region 6 into adjacent pixels. However, if the P-type semiconductor region 3 is disposed at a deeper position, the electric charge generated within the P-type semiconductor region 3 is likely to flow into the N-type semiconductor region 5, and the noise characteristics deteriorate. Therefore, the P-type semiconductor region 3 may be disposed at a shallower position, as long as the P-type semiconductor region 3 meets the above-described object. In this case, when the P-type semiconductor region 7 is caused to extend toward the first surface as the P-type semiconductor region 3 is disposed at a shallower position, the P-type semiconductor region 6 and the P-type semiconductor region 7 come closer to each other. When the impurity concentrations of the P-type semiconductor region 6 and the P-type semiconductor region 7 are equal to each other, the electric charge photoelectrically converted within the P-type semiconductor region 6 easily leaks into adjacent pixels through the P-type semiconductor region 7, so that color mixture components increase.

In order to solve the above-described problem, the P-type semiconductor region 3(a), the P-type semiconductor region 3(b) having a lower concentration than the P-type semiconductor region 3(a), and the P-type semiconductor region 7 having a lower concentration than the P-type semiconductor region 3(b) are sequentially formed in the depth direction from the first surface between adjacent pixels. In this case, the P-type semiconductor region 3(b) has a higher impurity concentration than that of the P-type semiconductor region 6, and the P-type semiconductor region 7 has a higher impurity concentration than that of the P-type semiconductor region 2. With these configurations, it is possible to reduce the contact resistance between the contact plug 17 and the substrate, prevent color mixture in adjacent pixels, and prevent a deterioration in noise characteristics.

Fourth Exemplary Embodiment

Figure 12:
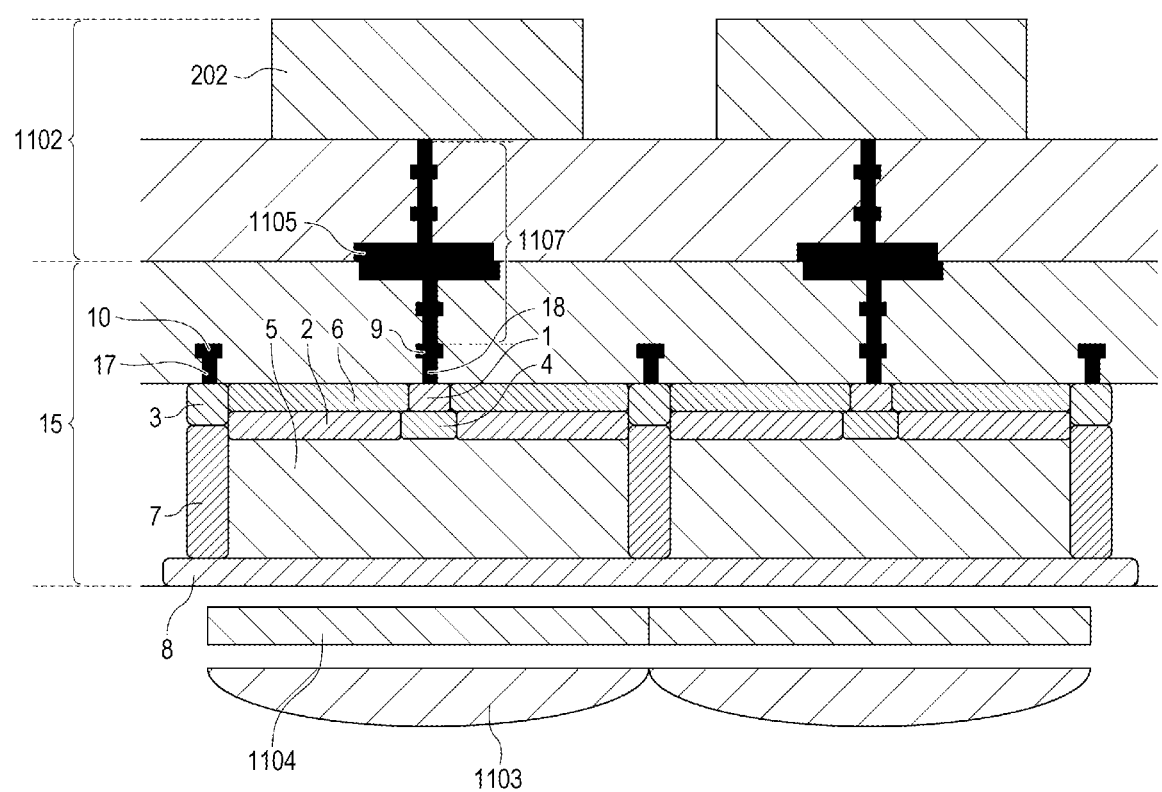
FIG. 12 is a schematic sectional view illustrating an avalanche diode.

FIG. 12 is a schematic cross-sectional view illustrating the avalanche diode and the control unit according to the present exemplary embodiment. Portions having functions similar to those illustrated in FIGS. 1 to 15B are denoted by the same reference numerals, and detailed descriptions thereof will be omitted.

In FIG. 12, the photoelectric conversion unit 201 and the control unit 202 are disposed on different semiconductor substrates. The configuration of the avalanche diode constituting the photoelectric conversion unit 201 is the same as that of the first exemplary embodiment. On the semiconductor substrate 15, a plurality of photoelectric conversion units 201 is arranged. In the present exemplary embodiment, two avalanche diodes are disposed. On a semiconductor substrate 1102, the control unit 202 and a wiring 1107 connected to the control unit 202 are disposed. In this case, the configuration in which the control unit 202 and the wiring 1107 are disposed on the semiconductor substrate 1102 is illustrated, but other circuits may be disposed.

The avalanche diode of the present exemplary embodiment is a backside irradiation-type configuration. In addition, light is incident in a direction from the N-type semiconductor region 5 to the N-type semiconductor region 1. In this case, the light enters the N-type semiconductor region 5 through a microlens 1103 and a color filter 1104.

As described above, the photoelectric conversion is performed in the N-type semiconductor region 5, and the generated electric charge passes through the N-type semiconductor region 4 and moves to the N-type semiconductor region 1. Avalanche amplification occurs due to the electric field between the N-type semiconductor region 1 and the depletion layer formed between the P-type semiconductor region 2 and the N-type semiconductor region 4, and a current flows through the wiring 9.

The wiring 9 is connected to the control unit 202 provided on the semiconductor substrate 1102, which is separately prepared, through a connection unit 1105.

Signals detected for each avalanche diode are subjected to signal processing by a scanning circuit or the like provided around the pixel unit of the semiconductor substrate 1102. The scanning circuit may be disposed on a semiconductor substrate different from the semiconductor substrate 15 and the semiconductor substrate 1102.

According to the configuration of the present exemplary embodiment, the different semiconductor substrate 1102 is stacked on the semiconductor substrate 15 on which the avalanche diode is disposed. A processing circuit such as the control unit 202 is disposed on the laminated semiconductor substrate 1102, thereby making it possible to increase the aperture ratio of the avalanche diode and improve the light detection efficiency.

In the present exemplary embodiment, when the microlens 1103 is disposed in each avalanche diode, a positional relationship may be set such that the optical axis of the microlens 1103 is included in the N-type semiconductor region 4 in a plan view. For example, when vertical light is incident at the central portion of the photoelectric conversion element 101, the distribution of occurrence probabilities of signal electric charge inside the N-type semiconductor region 5 becomes maximum near the optical axis of the microlens 1103. In this case, the optical axis of the microlens is an axis that passes through the center of the microlens in a plan view and is perpendicular to the semiconductor substrate 15.

Like in the configuration of the present exemplary embodiment, if the optical axis of the microlens 1103 is planarly included in the N-type semiconductor region 4 in a plan view, in the N-type semiconductor region 5, electric charge is likely to occur in a position close to the N-type semiconductor region 4 in a plan view. Further, it is possible to reduce the occurrence probability of electric charge generated at a far position in a plane, and it is also possible to prevent a deterioration in the time resolution until the electric charge is detected in the photodetection region by the electric charge generated at a shallower position with respect to the first surface of the semiconductor substrate 15 and the electric charge generated at a deeper position.

In the present exemplary embodiment, the backside illumination-type photodiode configuration is adopted. However, even with a frontside illumination-type photodiode configuration, it is possible to achieve the effect of the present exemplary embodiment, that is, the compatibility between a high light detection efficiency and a low DCR. However, in the present exemplary embodiment, the photoelectric conversion unit is formed on the back surface, the backside illumination-type photodiode configuration is superior to the frontside illumination-type diode configuration in that the electric charge generated in the vicinity of the outermost surface (the light incident side) of the substrate can be detected with a high efficiency. Specifically, from the viewpoint that a high light detection efficiency can be realized in a broad wavelength band from a short wavelength to a long wavelength, the backside illumination-type diode configuration is preferably used for the photoelectric conversion unit 201 of the present exemplary embodiment.

The present exemplary embodiment can be applied to all exemplary embodiments.

Fifth Exemplary Embodiment

Figure 13:
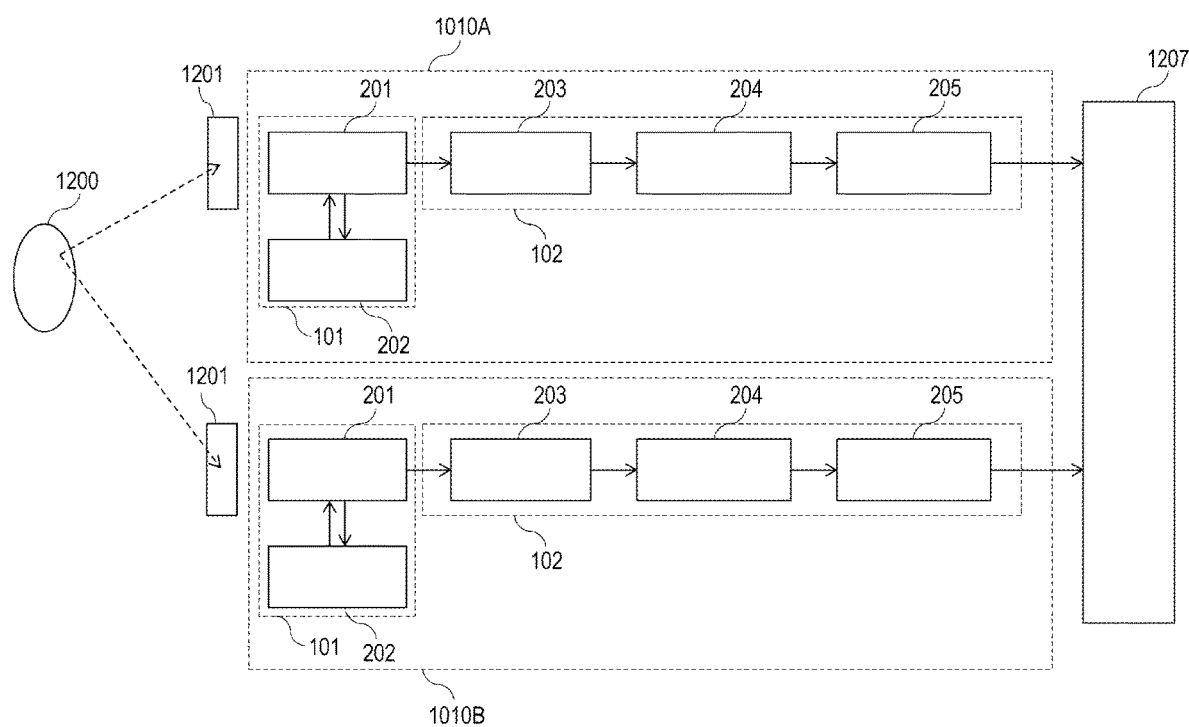
FIG. 13 is a block diagram illustrating a photodetection system.

The present exemplary embodiment illustrates an example of a photodetection system using the photodetection device 1010 of each exemplary embodiment. With reference to FIG. 13, an invisible light detection system as an example of a photodetection system and a medical diagnosis system such as a positron emission tomography (PET) will be described. Portions having functions similar to those illustrated in FIGS. 1 to 12 are denoted by the same reference numerals, and detailed descriptions thereof will be omitted. Each pixel 100 according to the present exemplary embodiment has a TDC and a memory instead of the counter circuit 209 illustrated in FIG. 5. In the present exemplary embodiment, a TDC 204 is used as the TDC and a memory 205 is used as the memory.

FIG. 13 is a block diagram illustrating the configuration of the invisible light detection system. The invisible light detection system includes a wavelength conversion unit 1201 and a data processing unit 1207, and a plurality of photodetection devices 1010.

An irradiation object 1200 emits light in a wavelength band that becomes invisible light. The wavelength conversion unit 1201 receives light in a wavelength band that is emitted from the irradiation object 1200 and becomes invisible light, and emits visible light.

The photoelectric conversion unit 201 on which the visible light emitted from the wavelength conversion unit 1201 is incident performs photoelectric conversion, and the photodetection device 1010 holds digital signals, which are based on the signal based on the photoelectrically converted electric charge, in the memory 205 via the control unit 202, the waveform shaping unit 203, and the TDC 204. The plurality of photodetection devices 1010 may be formed as a single device or may be formed by arranging a plurality of devices.

The data processing unit 1207 performs signal processing on the plurality of digital signals held in the memory 205 of each of the plurality of photodetection devices 1010. In this case, as signal processing, processing of combining a plurality of images obtained from the plurality of digital signals is carried out.

Next, the configuration of a medical diagnosis system such as a PET will be described as a specific example of the invisible light detection system.

A subject that is the irradiation object 1200 emits a radiation pair from the inside of the living body of the subject. The wavelength conversion unit 1201 constitutes a scintillator, and the scintillator emits visible light when a radiation pair emitted from a subject enters the scintillator.

The photoelectric conversion unit 201 on which the visible light emitted from the scintillator is incident performs photoelectric conversion, and the photodetection device 1010 holds digital signals, which are based on the signal based on the photoelectrically converted electric charge, in the memory 205 via the control unit 202, the waveform shaping unit 203, and the TDC 204. That is, the photodetection device 1010 is disposed to detect an arrival time of the radiation pair emitted from the subject, detects the visible light emitted from the scintillator, and holds digital signals in the memory 205.

The digital signals held in the memory 205 of each of the plurality of photodetection devices 1010 are subjected to signal processing in the data processing unit 1207. In this case, as signal processing, combining processing, such as image reconstruction, is performed using a plurality of images obtained from the plurality of digital signals, thereby forming an image within the living body of the subject.

Sixth Exemplary Embodiment

The present exemplary embodiment illustrates an example of a photodetection system using the photodetection device 1010 of each exemplary embodiment. Portions having functions similar to those illustrated in FIGS. 1 to 12 are denoted by the same reference numerals, and detailed descriptions thereof will be omitted.

Figure 14:
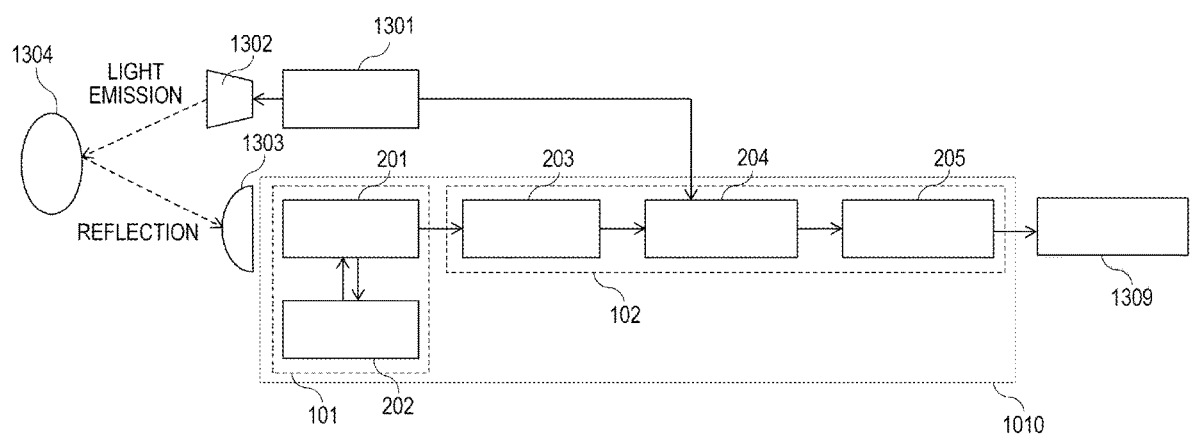
FIG. 14 is a block diagram illustrating the photodetection system.

FIG. 14 illustrates a distance detection system as an example of the photodetection system. Each pixel 100 according to the present exemplary embodiment has a TDC and a memory instead of the counter circuit 209 illustrated in FIG. 5. In the present exemplary embodiment, a TDC 204 is used as the TDC and a memory 205 is used as the memory.

An example of a block diagram of the distance detection system according to the present exemplary embodiment will be described with reference to FIG. 14. The distance detection system includes a light source control unit 1301, a light emitting unit 1302, an optical member 1303, the photodetection device 1010, and a distance calculation unit 1309.

The light source control unit 1301 controls driving of the light emitting unit 1302. Upon reception of a signal from the light source control unit 1301, the light emitting unit 1302 emits light of a short pulse (row) in an image capturing direction.

The light emitted from the light emitting unit 1302 is reflected by an object 1304. The reflected light is received by the photoelectric conversion unit 201 of the photodetection device 1010 through the optical member 1303, and the signal based on the photoelectrically converted electric charge is input to the TDC 204 via the waveform shaping unit 203.

The TDC 204 compares the signal obtained from the light source control unit 1301 with the signal input from the waveform shaping unit 203. Then, the time from the emission of the pulsed light by the light emitting unit 1302 to the reception of the reflected light reflected from the object 1304 is digitally converted with a high accuracy. The digital signal output from the TDC 204 is held in the memory 205.

The distance calculation unit 1309 calculates a distance from the photodetection device to the subject on the basis of the digital signals which are held in the memory 205 and correspond to a plurality of number of measurements. This distance detection system can be applied to, for example, an on-vehicle distance detection system.

Figure 15A:
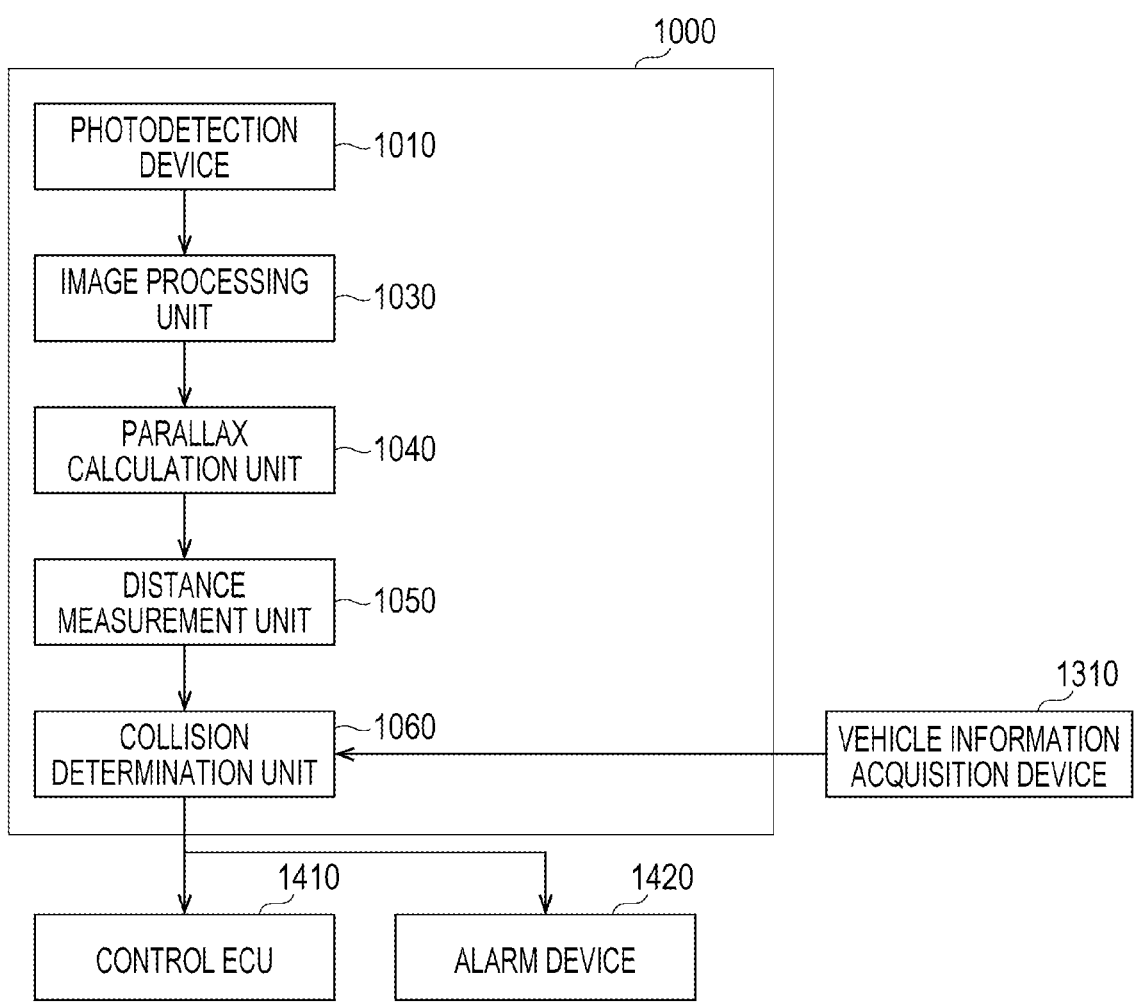
FIGS. 15A and 15B are block diagrams each illustrating the photodetection system.
Figure 15B:
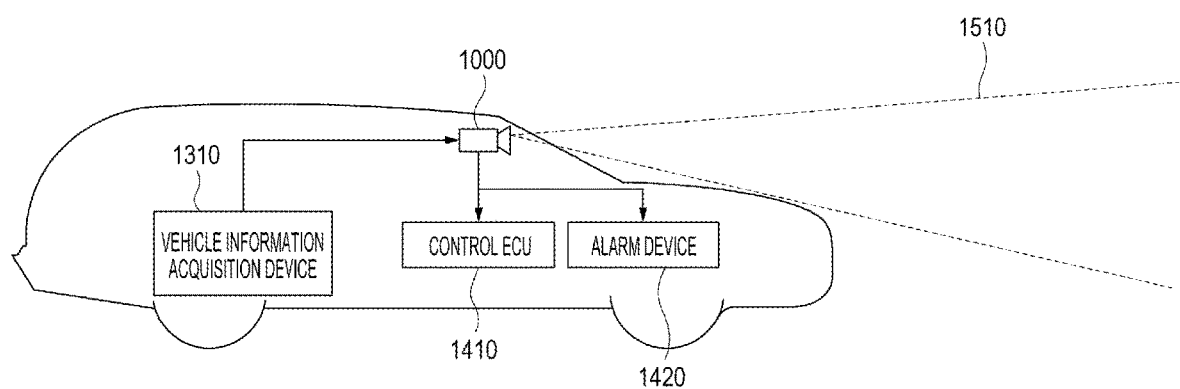

Next, FIGS. 15A and 15B illustrate an example of the photodetection system in a case where the counter circuit 209 illustrated in FIG. 5 is used. FIGS. 15A and 15B each illustrate the photodetection system relating to an on-vehicle camera which is an example of the photodetection system.

A photodetection system 1000 is a photodetection system including ranging pixels and imaging pixels according to the present disclosure. The photodetection system 1000 includes an image processing unit 1030 that performs image processing on a plurality of digital signals acquired by the photodetection device 1010. The photodetection system 1000 further includes a parallax calculation unit 1040 that calculates a parallax (a phase difference of a parallax image) from a plurality of pieces of image data acquired by the image processing unit 1030.

The photodetection system 1000 further includes a distance measurement unit 1050 that calculates a distance to an object based on the calculated parallax, a collision determination unit 1060 that determines whether there is a collision possibility based on the calculated distance. In this case, the parallax calculation unit 1040 and the distance measurement unit 1050 are examples of a distance information acquisition unit that acquires distance information about a distance to an object. That is, the distance information is information about a parallax, a defocus amount, a distance to an object, and the like.

A collision determination unit 1060 may determine the collision possibility by using any one of these pieces of distance information. The distance information acquisition unit may be implemented by exclusively designed hardware, may be implemented by a software module, or may be implemented by a combination of hardware and software. The distance information acquisition unit may also be implemented by a Field Programmable Gate Array (FPGA), an Application Specific Integrated Circuit (ASIC), or the like. Furthermore, the distance information acquisition unit may be implemented by a combination of options.

The photodetection system 1000 is connected to a vehicle information acquisition device 1310, and can acquire vehicle information such as a vehicle speed, a yaw rate, and a steering angle. The photodetection system 1000 is also connected to a control ECU 1410 which is a control device that outputs a control signal for generating a braking force to the vehicle based on the determination result of the collision determination unit 1060.

The photodetection system 1000 is also connected to an alarm device 1420 that issues an alarm to a driver based on the determination result of the collision determination unit 1060. For example, when the collision possibility is high as the determination result of the collision determination unit 1060, the control ECU 1410 performs a vehicle control to avoid a collision and reduce damage by, for example, applying a brake, returning an accelerator, or suppressing an engine output. The alarm device 1420 issues an alarm such as sound, displays alarm information on a screen of a car navigation system or the like, and gives a warning to a user by applying vibration to a seat belt or a steering wheel.

In the present exemplary embodiment, the photodetection system 1000 captures an image of the periphery of the vehicle, for example, the front or the back of the vehicle. FIG. 15B illustrates the photodetection system in the case of capturing an image of the front of the vehicle. Although the control for preventing a collision with another vehicle has been described above, the present disclosure is also applicable to a control for automatically operating a vehicle by following another vehicle, a control for automatically operating a vehicle so as not to deviate from a lane, and the like. Furthermore, the photodetection system is not limited to vehicles such as one's own vehicle, but can be applied to moving bodies (mobile devices) such as ships, aircrafts, and industrial robots. In addition, the photodetection system is applied not only to the moving bodies, but also to devices that widely use object recognition, such as an Intelligent Transportation System (ITS).

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-230987, filed Nov. 30, 2017, which is hereby incorporated by reference herein in its entirety.

What is claimed is:

1. A photodetection device comprising
a first semiconductor substrate including a first surface and a second surface opposite of the first surface; and
a pixel including an avalanche diode disposed on the first semiconductor substrate,
wherein the avalanche diode includes:
a first semiconductor region of a first conductivity type and a second semiconductor region of a second conductivity type disposed at a first depth from the first surface of the first semiconductor substrate, a polarity of the second conductivity type being different from a polarity of the first conductivity type, and the first semiconductor region configured to form part of the first surface of the first semiconductor substrate;
a third semiconductor region of the first conductivity type and a fourth semiconductor region of the second conductivity type disposed at a second depth from the first surface of the first semiconductor substrate, the second depth being deeper than the first depth, the fourth semiconductor region being in contact with the third semiconductor region, the third semiconductor region having a concentration of an impurity of the first conductivity type lower than a concentration of an impurity of the first conductivity type of the first semiconductor region, and the fourth semiconductor region having a concentration of an impurity of the second conductivity type lower than a concentration of an impurity of the second conductivity type of the second semiconductor region; and
a fifth semiconductor region of the first conductivity type disposed at a third depth from the first surface of the first semiconductor substrate, the third depth being deeper than the second depth, and the fifth semiconductor region having a concentration of the impurity of the first conductivity type lower than the concentration of an impurity of the first conductivity type of the third semiconductor region, and
wherein, in a plan view,
the first semiconductor region overlaps at least a part of the third semiconductor region, the second semiconductor region overlaps at least a part of the fourth semiconductor region, and the third semiconductor region and the fourth semiconductor region overlap the fifth semiconductor region.

2. The photodetection device according to claim 1, wherein
a sixth semiconductor region of the first conductivity type is disposed between the first semiconductor region and the second semiconductor region, and
the sixth semiconductor region has a concentration of the impurity of the first conductivity type lower than the concentration of the impurity of the first conductivity type of the first semiconductor region.

3. A photodetection device comprising:
a semiconductor substrate including a first surface and a second surface opposite of the first surface; and
a pixel including an avalanche diode disposed on the semiconductor substrate,
wherein the avalanche diode includes:
a first semiconductor region of a first conductivity type same as a conductivity type of a signal electric charge and a second semiconductor region of a second conductivity type disposed at a first depth from the first surface of the semiconductor substrate, a polarity of the second conductivity type being different from a polarity of the first conductivity type;
a third semiconductor region and a fourth semiconductor region disposed at a second depth from the first surface of the semiconductor substrate, the second depth deeper than the first depth, the fourth semiconductor region being in contact with the third semiconductor region, and a concentration of an impurity of the second conductivity type of the fourth semiconductor region lower than a concentration of an impurity of the second conductivity type of the second semiconductor region;
a fifth semiconductor region disposed at a third depth from the first surface of the semiconductor substrate, the third depth deeper than the second depth; and
a sixth semiconductor region disposed between the first semiconductor region and the second semiconductor region, and
wherein, in a plan view,
the first semiconductor region overlaps at least a part of the third semiconductor region, the second semiconductor region overlaps at least a part of the fourth semiconductor region, and the third semiconductor region and the fourth semiconductor region overlap the fifth semiconductor region, a height of a potential of the third semiconductor region with respect to the electric charge of the first conductivity type is lower than a height of a potential of the fourth semiconductor region with respect to the electric charge of the first conductivity type, and the height of the potential of the fourth semiconductor region with respect to the electric charge of the first conductivity type is higher than a height of a potential of the fifth semiconductor region with respect to the electric charge of the first conductivity type.

4. The photodetection device according to claim 1, wherein in the plan view, the first semiconductor region is surrounded by the second semiconductor region.

5. The photodetection device according to claim 1, wherein in the plan view, the third semiconductor region is surrounded by the fourth semiconductor region.

6. The photodetection device according to claim 3, wherein the third semiconductor region is a semiconductor region of the first conductivity type.

7. The photodetection device according to claim 6, wherein the fifth semiconductor region is a semiconductor region of the first conductivity type.

8. The photodetection device according to claim 3, wherein the third semiconductor region is a semiconductor region of the second conductivity type having a concentration of the impurity of the second conductivity type lower than the concentration of the impurity of the second conductivity type of the fourth semiconductor region.

9. The photodetection device according to claim 3, wherein the fifth semiconductor region is a semiconductor region of the second conductivity type.

10. The photodetection device according to claim 1, wherein a semiconductor region of the second conductivity type is further disposed in a depth direction of the first semiconductor substrate between the second semiconductor region and the fourth semiconductor region, the semiconductor region has a concentration of the impurity of the second conductivity type lower than the concentration of the impurity of the second conductivity type of the second semiconductor region, and has the concentration of the impurity of the second conductivity type higher than the concentration of the impurity of the second conductivity type of the fourth semiconductor region.

11. The photodetection device according to claim 1, further comprising a plurality of the pixels, wherein each respective pixel includes the respective avalanche diode,
wherein a seventh semiconductor region of the second conductivity type is disposed between the second semiconductor region of a first pixel of the plurality of the pixels and the second semiconductor region of a second pixel of the plurality of the pixels,
the second semiconductor region of the first pixel is surrounded by the seventh semiconductor region in the plan view, and
the seventh semiconductor region is in contact with the second semiconductor region of the first pixel, and has a concentration of the impurity of the second conductivity type higher than the concentration of the impurity of the second conductivity type of the second semiconductor region of the first pixel.

12. The photodetection device according to claim 11, wherein an eighth semiconductor region is in contact with the fourth semiconductor region, and has a concentration of the impurity of the second conductivity type lower than the concentration of the impurity of the second conductivity type of the seventh semiconductor region, and
in the plan view, the fourth semiconductor region is surrounded by the eighth semiconductor region.

13. The photodetection device according to claim 11, wherein
the first semiconductor substrate includes an eighth semiconductor region of the second conductivity type disposed at a fourth depth from the first surface of the first semiconductor substrate, the fourth depth being deeper than the third depth, and
the eighth semiconductor region is electrically connected to the eighth semiconductor region.

14. The photodetection device according to claim 12, wherein a ninth semiconductor region of the second conductivity type disposed between the seventh semiconductor region and the eighth semiconductor region, and has a concentration of the impurity of the second conductivity type lower than the concentration of the impurity of the second conductivity type of the seventh semiconductor region, and has the concentration of the impurity of the second conductivity type higher than the concentration of the impurity of the second conductivity type of the second semiconductor region and the eighth semiconductor region.

15. The photodetection device according to claim 1, wherein the third semiconductor region and the fourth semiconductor region form a PN-junction, and
the impurity concentration of the third semiconductor region is an impurity concentration at which the entire third semiconductor region is depleted in a case where a reverse basis potential is supplied to the PN-junction.

16. The photodetection device according to claim 1, further comprising a second semiconductor substrate different from the first semiconductor substrate, the second semiconductor substrate includes
a control unit disposed on the second semiconductor substrate and configured to control a potential to be supplied to the first semiconductor region, wherein
the first semiconductor substrate and the second semiconductor substrate are stacked, and
the first semiconductor region and the control unit are electrically connected through a wiring.

17. A photodetection system including a plurality of the photodetection devices according to claim 1, the photodetection system comprising:
a light-emitting unit configured to emit light to be detected by the photodetection device; and
a distance calculation unit configured to calculate a distance using a digital signal held in the photodetection device.

18. A moving body comprising:
the photodetection device according to claim 1;
a distance information acquisition unit configured to acquire information about a distance from a parallax image based on a signal from the photodetection device to a target object; and
a control unit configured to control the moving body based on the distance information.

19. The photodetection device according to claim 1, wherein
a sixth semiconductor region of the second conductivity type is disposed between the first semiconductor region and the second semiconductor region, and
the sixth semiconductor region has a concentration of the impurity of the second conductivity type lower than the concentration of the impurity of the second conductivity type of the second semiconductor region.

20. The photodetection device according to claim 1, wherein
the first semiconductor substrate includes a sixth semiconductor region of the second conductivity type disposed at a fourth depth from the first surface of the first semiconductor substrate, the fourth depth being deeper than the third depth.

21. The photodetection device according to claim 20, wherein
a first contact plug which electrically connected to the first semiconductor region and a second contact plug which electrically connected to the fourth semiconductor region are disposed on the first surface of the first semiconductor substrate.

* * * * *